United States Patent
Ito et al.

(10) Patent No.: US 10,192,766 B2
(45) Date of Patent: Jan. 29, 2019

(54) ELECTROSTATIC CHUCK DEVICE

(71) Applicant: SUMITOMO OSAKA CEMENT CO., LTD., Tokyo (JP)

(72) Inventors: Tomomi Ito, Tokyo (JP); Yukio Miura, Tokyo (JP)

(73) Assignee: SUMITOMO OSAKA CEMENT CO., LTD., Tokyo (JP)

(*) Notice: Subject to any disclaimer, the term of this patent is extended or adjusted under 35 U.S.C. 154(b) by 0 days.

(21) Appl. No.: 15/519,098

(22) PCT Filed: Oct. 15, 2015

(86) PCT No.: PCT/JP2015/079188
§ 371 (c)(1),
(2) Date: Apr. 13, 2017

(87) PCT Pub. No.: WO2016/060205
PCT Pub. Date: Apr. 21, 2016

(65) Prior Publication Data
US 2017/0229335 A1 Aug. 10, 2017

(30) Foreign Application Priority Data

Oct. 17, 2014 (JP) .................................. 2014-212590
Jan. 16, 2015 (JP) .................................. 2015-006981
Mar. 10, 2015 (JP) .................................. 2015-047086

(51) Int. Cl.
*H01L 21/683* (2006.01)
*H02N 13/00* (2006.01)

(52) U.S. Cl.
CPC ........ *H01L 21/6833* (2013.01); *H01L 21/683* (2013.01); *H02N 13/00* (2013.01)

(58) Field of Classification Search
CPC .... H01L 21/6833; H01L 21/683; H02N 13/00
See application file for complete search history.

(56) References Cited

U.S. PATENT DOCUMENTS 2,440,711 A * 5/1948 Bechtold .................. C08J 7/047
427/379
6,071,630 A * 6/2000 Tomaru .................. B23Q 3/154
279/128

(Continued)

FOREIGN PATENT DOCUMENTS

JP 2008-282875 A 11/2008
JP 2009-54932 A 3/2009

(Continued)

OTHER PUBLICATIONS

International Search Report dated Dec. 8, 2015 for PCT/JP2015/079188.

*Primary Examiner* — Zeev V Kitov
(74) *Attorney, Agent, or Firm* — Greenblum & Bernstein, P.L.C.

(57) ABSTRACT

An electrostatic chuck device 80 includes: an electrostatic chuck section 2 having one principal surface serving as a placing surface on which a plate-shaped sample is placed, and having a built-in electrostatic attracting internal electrode; a first adhesion layer 4; a sheet material 6; a second adhesion layer 8; and a temperature adjusting base section 10 which adjusts a temperature of the electrostatic chuck section 2 to a desired temperature, in this order, in which the first adhesion layer 4 includes a joining layer 14 having a layer thickness in a range of 1 nm to 500 nm, and a silicone adhesive layer 24 having a thickness in a range of 2 μm to 30 μm, and the second adhesion layer 8 includes a joining layer 18 having a layer thickness in a range of 1 nm to 500 nm, and a silicone adhesive layer 28 having a thickness in a range of 2 μm to 30 μm.

11 Claims, 4 Drawing Sheets

(56) References Cited

U.S. PATENT DOCUMENTS

| | | | |
|---|---|---|---|
| 2006/0011611 A1* | 1/2006 | Goto | H01L 21/67103 219/444.1 |
| 2008/0278883 A1 | 11/2008 | Shiraiwa et al. | |
| 2009/0059461 A1 | 3/2009 | Yonekura et al. | |
| 2010/0173167 A1* | 7/2010 | Vissing | B05D 3/06 428/447 |
| 2012/0107613 A1* | 5/2012 | Kano | C23C 16/34 428/408 |
| 2012/0281334 A1* | 11/2012 | Sasaki | H01L 21/6831 361/234 |

FOREIGN PATENT DOCUMENTS

| | | |
|---|---|---|
| JP | 2011-159684 A | 8/2011 |
| JP | 2013-74251 A | 4/2013 |

* cited by examiner

ELECTROSTATIC CHUCK DEVICE

TECHNICAL FIELD

The present invention relates to an electrostatic chuck device.

BACKGROUND ART

In a semiconductor manufacturing process, in the processing of a wafer, an electrostatic chuck device is used as a device for easily mounting and fixing the wafer on and to a sample stage and maintaining the wafer at a desired temperature.

Finer processing of the wafer is progressing according to higher integration and higher performance of a semiconductor element, and a plasma etching technique which is high in production efficiency and enables fine processing of a large area is frequently used. If the wafer fixed to the electrostatic chuck device is irradiated with plasma, the surface temperature of the wafer rises. Therefore, in order to suppress a rise in the surface temperature, the wafer is cooled from the lower side by circulating a cooling medium such as water in a temperature adjusting base section of the electrostatic chuck device. However, at this time, due to unevenness of heat input to the wafer by plasma in the surface of the wafer, a temperature distribution occurs in the surface of the wafer. For example, a temperature tends to become high at a central part of the wafer and become low at an edge portion of the wafer.

For example, in an electrostatic chuck device which adjusts an in-plane temperature distribution of a wafer using gas such as helium, or an electrostatic chuck device having an adjusted contact area between a wafer and the attracting surface of an electrostatic chuck, it is difficult to perform local temperature control.

Further, in an electrostatic chuck device with a heater function according to the related art, there is a case where cracks are generated in an electrostatic chuck section, a temperature adjusting base section, or a heater itself due to rapid rise and fall in temperature of the heater, and thus there is a problem in which durability as an electrostatic chuck device is insufficient.

In order to solve such a problem, in the related art, there is disclosed, for example, an electrostatic chuck device in which in a case of being applied to a treatment apparatus such as a plasma etching apparatus, it is possible to perform local temperature control of a plate-shaped sample such as a silicon wafer associated with plasma application by generating a local temperature distribution in the surface of the plate-shaped sample such as a silicon wafer (refer to, for example, Patent Literature No. 1).

CITATION LIST

Patent Literature

[Patent Literature No. 1] Japanese Laid-open Patent Publication No. 2011-159684

SUMMARY OF INVENTION

Technical Problem

In order to further suppress variation in the in-plane temperature of the wafer, it is required to further enhance in-plane temperature uniformity of the electrostatic chuck section to which the wafer is fixed.

The present invention has an object to provide an electrostatic chuck device in which adhesiveness between an electrostatic chuck section and a base section is excellent and in-plane temperature uniformity of the electrostatic chuck section is excellent, and a task thereof is to achieve the object.

Solution to Problem

Specific means for achieving the above task is as follows.

<1> An electrostatic chuck device including: an electrostatic chuck section having one principal surface serving as a placing surface on which a plate-shaped sample is placed, and having a built-in electrostatic attracting internal electrode; a first adhesion layer; a sheet material; a second adhesion layer; and a temperature adjusting base section which adjusts a temperature of the electrostatic chuck section to a desired temperature, in this order, in which the first adhesion layer includes a joining layer having a layer thickness in a range of 1 nm to 500 nm, and a silicone adhesive layer having a thickness in a range of 2 μm to 30 μm, and the second adhesion layer includes a joining layer having a layer thickness in a range of 1 nm to 500 nm, and a silicone adhesive layer having a thickness in a range of 2 μm to 30 μm.

<2> An electrostatic chuck device including: an electrostatic chuck section having one principal surface serving as a placing surface on which a plate-shaped sample is placed, and having a built-in electrostatic attracting internal electrode; a plurality of heating members bonded to a surface on the side opposite to the placing surface of the electrostatic chuck section in a pattern having a gap with respect to one another; a first adhesion layer; a sheet material; a second adhesion layer; and a base section having a function of cooling the electrostatic chuck section, in this order, in which the first adhesion layer includes a joining layer having a layer thickness in a range of 1 nm to 500 nm, and a silicone adhesive layer having a thickness in a range of 2 μm to 30 μm, and the second adhesion layer includes a joining layer having a layer thickness in a range of 1 nm to 500 nm, and a silicone adhesive layer having a thickness in a range of 2 μm to 30 μm.

<3> The electrostatic chuck device according to the above <2>, further including: a polymer material layer filling up the gap between the heating members, in which a layer thickness of the polymer material layer is the same as the shortest distance from the surface on the side opposite to the placing surface of the electrostatic chuck section to a surface on the first adhesion layer side of the heating member.

<4> The electrostatic chuck device according to the above <2>, further including: a polymer material layer filling up the gap between the heating members and covering surfaces of the heating members, in which a surface of the polymer material layer is flat.

<5> The electrostatic chuck device according to any one of the above <2> to <4>, further including: an insulating material layer provided between the heating members and the base section.

<6> The electrostatic chuck device according to any one of the above <1> to <5>, in which the joining layer is a layer having a structure derived from a compound having at least one reactive functional group which is selected from a group consisting of an epoxy group, an isocyanate group, an amino group, a mercapto group, a vinyl group, a styryl group, a methacryl group, an acryl group, an ureido group, a sulfide group, and an isocyanurate group.

<7> The electrostatic chuck device according to the above <6>, in which the compound having a reactive functional group further has a hydrolyzable group.

<8> The electrostatic chuck device according to the above <7>, in which the compound having a reactive functional group is represented by the following general formula (1).

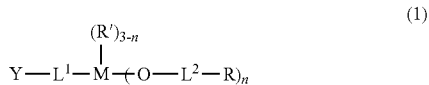

[In the general formula (1), Y represents an epoxy group, an isocyanate group, an amino group, a mercapto group, a vinyl group, a styryl group, a methacryl group, an acryl group, an ureido group, a sulfide group, or an isocyanurate group, $L^1$ represents a linking group, M represents a silicon atom, a titanium atom, or a zirconium atom, R represents an alkyl group having 1 to 5 carbon atoms, $L^2$ represents a single bond or carbonyl, n represents an integer of 1, 2, or 3, and R' represents an alkyl group having 1 to 3 carbon atoms, or a phenyl group.]

<9> The electrostatic chuck device according to any one of the above <1> to <8>, in which the sheet material is thicker than a total layer thickness of the first adhesion layer and the second adhesion layer, and a thickness of the sheet material is in a range of 20 µm to 500 µm.

<10> The electrostatic chuck device according to any one of the above <1> to <9>, in which the sheet material contains any one which is selected from a group consisting of a silicone-based elastomer and a fluorine-based elastomer.

<11> The electrostatic chuck device according to any one of the above <1> to <10>, in which the placing surface is composed of an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

Advantageous Effects of Invention

According to the present invention, an electrostatic chuck device is provided in which the adhesiveness between an electrostatic chuck section and a base section is excellent and the in-plane temperature uniformity of the electrostatic chuck section is excellent.

DESCRIPTION OF EMBODIMENTS

<Electrostatic Chuck Device>

An electrostatic chuck device according to a first embodiment of the present invention includes: an electrostatic chuck section having one principal surface serving as a placing surface on which a plate-shaped sample is placed, and having a built-in electrostatic attracting internal electrode; a first adhesion layer; a sheet material; a second adhesion layer; and a temperature adjusting base section which adjusts a temperature of the electrostatic chuck section to a desired temperature, in this order, in which the first adhesion layer includes a joining layer having a layer thickness in a range of 1 nm to 500 nm, and a silicone adhesive layer having a thickness in a range of 2 µm to 30 µm, and the second adhesion layer includes a joining layer having a layer thickness in a range of 1 nm to 500 nm, and a silicone adhesive layer having a thickness in a range of 2 µm to 30 µm.

An electrostatic chuck device according to a second embodiment of the present invention includes: an electrostatic chuck section having one principal surface serving as a placing surface on which a plate-shaped sample is placed, and having a built-in electrostatic attracting internal electrode; a plurality of heating members bonded to a surface on the side opposite to the placing surface of the electrostatic chuck section in a pattern having a gap with respect to one another; a first adhesion layer; a sheet material; a second adhesion layer; and a base section having a function of cooling the electrostatic chuck section, in this order, in which the first adhesion layer includes a joining layer having a layer thickness in a range of 1 nm to 500 nm, and a silicone adhesive layer having a thickness in a range of 2 µm to 30 µm, and the second adhesion layer includes a joining layer having a layer thickness in a range of 1 nm to 500 nm, and a silicone adhesive layer having a thickness in a range of 2 µm to 30 µm.

First, the laminated configuration of the electrostatic chuck section, the first and second adhesion layers, the sheet material, and the temperature adjusting base section in the electrostatic chuck device according to the first embodiment of the present invention will be described.

(1) Electrostatic Chuck Device According to First Embodiment

Figure 1:
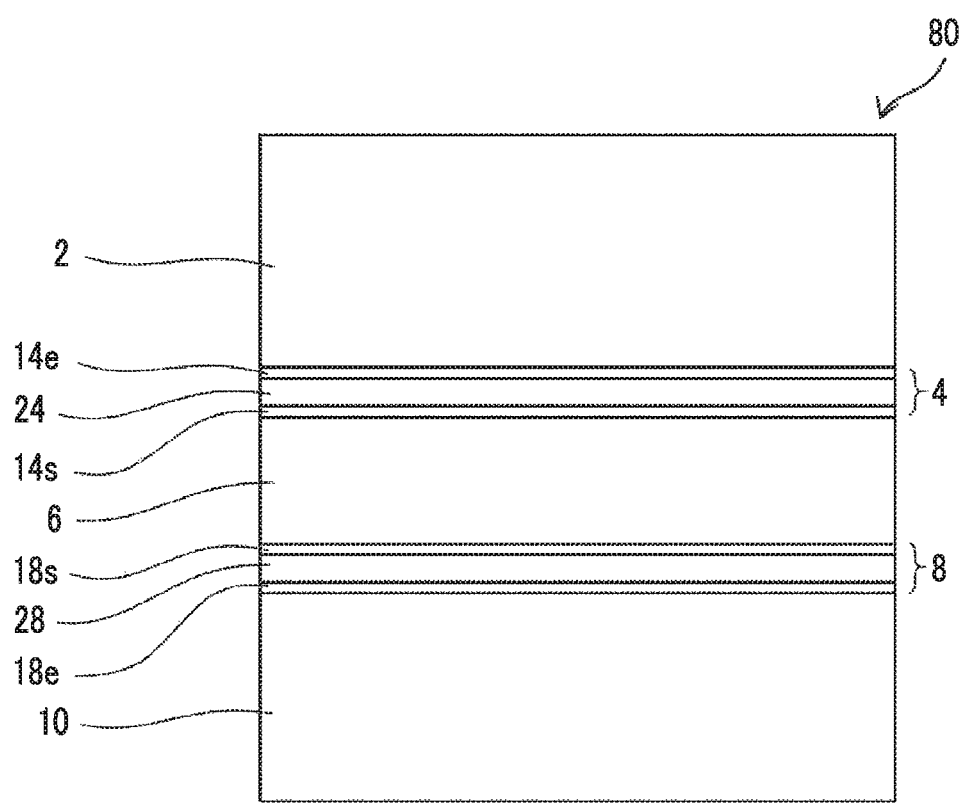
FIG. 1 is a cross-sectional schematic diagram showing an example of a laminated configuration of an electrostatic chuck device according to the present invention.

FIG. 1 is a schematic diagram showing an example of the laminated configuration of the electrostatic chuck device according to the first embodiment of the present invention.

An electrostatic chuck device 80 has an electrostatic chuck section 2 to which a wafer is fixed, and a thick disk-shaped temperature adjusting base section 10 which adjusts the temperature of the electrostatic chuck section 2 to a desired temperature. A first adhesion layer 4, a sheet material 6, and a second adhesion layer 8 are provided in order from the electrostatic chuck section 2 side between the electrostatic chuck section 2 and the temperature adjusting base section 10.

The first adhesion layer 4 in FIG. 1 has a joining layer 14 and a silicone adhesive layer (a first silicone adhesive layer) 24. The first adhesion layer 4 in FIG. 1 has two joining layers 14 (14e and 14s). However, the first adhesion layer 4 may have only the joining layer 14e on the electrostatic chuck section 2 side or may have only the joining layer 14s on the sheet material 6 side. That is, for example, a configuration is also acceptable in which the silicone adhesive layer 24 is located on one side of the electrostatic chuck section 2 side and the sheet material 6 side and the joining layer 14 is located on the other side.

Similarly, the second adhesion layer 8 has a joining layer 18 and a silicone adhesive layer (a second silicone adhesive layer) 28. The second adhesion layer 8 in FIG. 1 has two joining layers 18 (18e and 18s). However, the second adhesion layer 8 may have only the joining layer 18s on the sheet material 6 side or may have only the joining layer 18e on the temperature adjusting base section 10 side. That is, for example, a configuration is also acceptable in which the silicone adhesive layer 28 is located on one side of the sheet material 6 side and the temperature adjusting base section 10 side and the joining layer 18 is located on the other side.

In the electrostatic chuck device 80 according to the present invention, since the joining layer 14 and the silicone adhesive layer 24 are inter posed between the electrostatic chuck section 2 and the sheet material 6 and the joining layer 18 and the silicone adhesive layer 28 are interposed between the sheet material 6 and the temperature adjusting base section 10, it is considered that the adhesiveness between the electrostatic chuck section and the temperature adjusting base section is excellent. Further, since the layer thickness of each of the joining layer 14 and the joining layer 18 is a thickness in a range of 1 nm to 500 nm and each of the silicone adhesive layer 24 and the silicone adhesive layer 28 has a thickness in a range of 2 μm to 30 μm, it is considered that variation in thermal conductivity from the temperature adjusting base section 10 to the electrostatic chuck section is suppressed and the in-plane temperature uniformity of the electrostatic chuck section is excellent.

The laminated configuration of the electrostatic chuck device according to the present invention is not limited to the configuration shown in FIG. 1.

Hereinafter, description will be made with reference numerals omitted.

[Adhesion Layer, Joining Layer]

The electrostatic chuck device according to the first embodiment of the present invention is provided with the first adhesion layer which bonds the electrostatic chuck section and the sheet material together, and the second adhesion layer which bonds the sheet material and the temperature adjusting base section together.

Further, the first adhesion layer includes the joining layer having a layer thickness in a range of 1 nm to 500 nm, and the silicone adhesive layer having a thickness in a range of 2 μm to 30 μm, and the second adhesion layer includes the joining layer having a layer thickness in a range of 1 nm to 500 nm, and the silicone adhesive layer having a thickness in a range of 2 μm to 30 μm. Each of the first adhesion layer and the second adhesion layer includes the joining layer having a layer thickness in a range of 1 nm to 500 nm and the silicone adhesive layer having a thickness in a range of 2 μm to 30 μm, whereby the adhesiveness between the electrostatic chuck section and the temperature adjusting base section is excellent and the in-plane temperature uniformity of the electrostatic chuck section is excellent.

It is difficult to make the layer thickness of the joining layer smaller than the molecular size of a compound configuring the joining layer, and from such a viewpoint, the layer thickness is set to be 1 nm or more. Further, the layer thickness of the joining layer is set to be 500 nm or less, whereby the in-plane temperature uniformity of the electrostatic chuck section is excellent.

The layer thickness of the joining layer is preferably in a range of 2 nm to 300 nm and more preferably in a range of 2 nm to 150 nm.

Further, the adhesion layer may have a plurality of joining layers. However, from the viewpoint of the in-plane temperature uniformity of the electrostatic chuck section, it is preferable that the total layer thickness of the joining layers is 2000 nm or less.

Each of the first adhesion layer and the second adhesion layer has the silicone adhesive layer in addition to the joining layer. The adhesion layer further includes the silicone adhesive layer, whereby it is possible to strengthen the adhesion between the electrostatic chuck section and the sheet material and the adhesion between the sheet material and the temperature adjusting base section.

Each of the first adhesion layer and the second adhesion layer may have each of the joining layer and the silicone adhesive layer in a single layer or may have it in two or more layers.

For example, a laminated configuration in which the first adhesion layer has the silicone adhesive layer, the first adhesion layer has two layers of joining layers, and the silicon adhesive layer is located between the joining layer on the electrostatic chuck section side and the joining layer on the sheet material side; and a laminated configuration in which the second adhesion layer has two layers of joining layers, the second silicone adhesive layer is located between the joining layer on the sheet material side and the joining layer on the temperature adjusting base section side can be given as an example.

The first adhesion layer and the second adhesion layer may be the same or may be different from each other.

The joining layer is preferably a layer having a structure derived from a compound having at least one reactive functional group which is selected from the group consisting of an epoxy group, an isocyanate group, an amino group, a mercapto group, a vinyl group, a styryl group, a methacryl group, an acryl group, an ureido group, a sulfide group, and an isocyanurate group. Hereinafter, there is a case where the compound having a reactive functional group is referred to as a compound for a joining layer.

The joining layer is formed using the compound for a joining layer, whereby the reactivity, the affinity, the close contact property, and the like between the compound for a joining layer, a component (for example, a sintered compact which includes aluminum) configuring the surface of the electrostatic chuck section, a component (for example, silicone resin) configuring the surface of the sheet material, and a component (for example, aluminum) configuring the surface of the temperature adjusting base section are excellent, and as a result, it is easy to reduce the layer thickness of the joining layer.

The compound for a joining layer will be described in more detail.

(Compound for Joining Layer)

The compound for a joining layer has at least one reactive functional group which is selected from the group consisting of an epoxy group, an isocyanate group, an amino group, a mercapto group, a vinyl group, a styryl group, a methacryl group, an acryl group, an ureido group, a sulfide group, and an isocyanurate group.

The reactive functional group of the compound for a joining layer is excellent in reactivity with an organic compound such as rubber, a polymer compound, or resin. As the reactive functional group, among the above, an epoxy group, an isocyanate group, an amino group, or a mercapto group is preferable.

It is preferable that the compound for a joining layer further has a hydrolyzable group. The hydrolyzable group is easily bonded to an inorganic compound such as glass, metal, or a metal oxide and also easily bonded to silicone resin, and therefore, a close contact property is excellent.

As the hydrolyzable group, an alkoxy group, an acyloxy group, or the like can be given as an example.

The alkoxy group has preferably 1 to 5 carbon atoms, and the alkyl group moiety of the alkoxy group may be linear, branched, or cyclic. Specifically, a methoxy group, an ethoxy group, a propyloxy group, an isopropyloxy group, a butoxy group, or the like can be given as an example.

The acyloxy group has preferably 1 to 5 carbon atoms, and the alkyl group moiety of the acyloxy group may be linear, branched, or cyclic. Specifically, an acetyloxy group, a propanoyloxy group, a butanoyloxy group, a pentanoyloxy group, or the like can be given as an example.

The number of carbon atoms of the alkoxy group is more preferably in a range of 1 to 3 and further preferably in a range of 1 to 2. The number of carbon atoms of the acyloxy group is more preferably in a range of 1 to 3 and further preferably in a range of 1 to 2.

The compound for a joining layer is preferably represented by the following general formula (1).

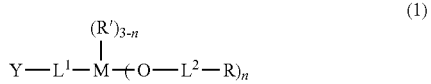

(1)

In the general formula (1), Y is a reactive functional group and represents an epoxy group, an isocyanate group, an amino group, a mercapto group, a vinyl group, a styryl group, a methacryl group, an acryl group, an ureido group, a sulfide group, or an isocyanurate group. $L^1$ represents a linking group.

M represents a silicon atom, a titanium atom, or a zirconium atom.

R represents an alkyl group having 1 to 5 carbon atoms, $L^2$ represents a single bond or carbonyl, and n represents an integer of 1, 2, or 3. R' represents an alkyl group having 1 to 3 carbon atoms, or a phenyl group.

From the viewpoint of the hydrolyzability of the compound for a joining layer, it is preferable that Y is an epoxy group, an isocyanate group, an amino group, or a mercapto group, among the above.

As the linking group which is represented by $L^1$, any one of a single bond, an alkylene group having 1 to 4 carbon atoms, an alkenylene group having 2 to 8 carbon atoms, an alkynylene group having 2 to 8 carbon atoms, a carbonyl group, an oxygen atom, a sulfur atom, and the like, or combinations thereof can be given as an example.

Among them, from the viewpoint of the hydrolyzability of the compound for a joining layer and the viewpoint of increasing the concentration of the reactive functional group, it is preferable that $L^1$ is a single bond.

Here, the concentration of the reactive functional group refers to the mole number of the reactive functional group (Y) per unit mass of the compound for a joining layer.

In the general formula (1), the group which is represented by $(O\text{-}L^2\text{-}R)_n$ is a hydrolyzable group.

$L^2$ represents a single bond or a carbonyl group and is preferably a single bond.

The alkyl group which is represented by R may be linear, branched, or cyclic, and a methyl group, an ethyl group, an n-propylisopropyl group, an n-butyl group, a t-butyl group, an n-pentyl group, or the like can be given as an example thereof. The number of carbon atoms of R is preferably in a range of 1 to 3.

The smaller the n, that is, the larger the $O\text{-}L^2\text{-}R$ in the general formula (1), the better the reactivity with an inorganic compound and silicone resin. It is preferable that n is an integer of 2 or 3.

From the viewpoint of the reactivity of the compound for a joining layer and the availability of the compound for a joining layer, it is preferable that M is a silicon atom (Si).

The alkyl group which is represented by R' may be linear or branched, and a methyl group, an ethyl group, an n-pропylisopropyl group, or the like can be given as an example thereof. The number of carbon atoms of R is preferably in a range of 1 to 2.

As the compound for a joining layer, a commercially available product may be used, and for example, a silane coupling agent (for example, KBM-903, KBM-403, KBM-803, KBE-9007, KBM-1003, KBM-5103, KBM-503, or the like) of Shin-Etsu Chemical Co., Ltd. can be suitably used.

Although the details of a method of manufacturing the electrostatic chuck device according to the first embodiment will be described later, in a case where a compound for a joining layer having a hydrolyzable group is used in the formation of the joining layer, it is preferable to use it as a solution for a joining layer which is obtained by adding alcohol (for example, isopropyl alcohol), water, and a catalyst (for example, a hydrochloric acid, a nitric acid, ammonia, or the like) to the compound for a joining layer, performing heating, and performing hydrolysis.

By hydrolyzing the compound for a joining layer in advance and then forming the joining layer using it as a solution for a joining layer, it is possible to suppress generation of air bubbles due to hydrolysis after the formation of the joining layer and suppress a decrease in the in-plane temperature uniformity of the electrostatic chuck section.

The compound for a joining layer subjected to hydrolysis has a structure in which $(O\text{-}L^2\text{-}R)_n$ in the general formula (1) is represented by $(OH)_n$.

(Silicone Adhesive Layer)

Each of the first adhesion layer and the second adhesion layer further has the silicone adhesive layer. As described previously, the adhesion layer further includes the silicone adhesive layer, whereby it is possible to further strengthen the adhesion between the electrostatic chuck section and the sheet material and the adhesion between the sheet material and the temperature adjusting base section.

With respect to the thickness of the silicone adhesive layer, each of the first silicone adhesive layer and the second silicone adhesive layer is in a range of 2 μm to 30 μm. The thickness of the silicone adhesive layer is 2 μm or more, whereby a strong adhesive force can be obtained, and the thickness of the silicone adhesive layer is 30 μm or less, it is difficult to impair the in-plane temperature uniformity of the electrostatic chuck section.

The thickness of the silicone adhesive layer is preferably in a range of 2 μm to 20 μm and more preferably in a range of 2 μm to 15 μm.

The position of the silicone adhesive layer is not limited as long as it is within the adhesion layer.

For example, a configuration in which the first silicone adhesive layer is located on one side of the electrostatic chuck section side and the sheet material side and the joining layer is on the other side, or a configuration in which the second silicone adhesive layer is located on one side of the sheet material side and the temperature adjusting base section side and the joining layer is on the other side is also acceptable.

Further, the silicone adhesive layer may be located between two joining layers, as described as a laminated configuration in which the adhesion layer includes two or more joining layers.

The silicone adhesive layer includes at least silicone rubber and may include other resin such as epoxy resin or polyimide resin, and a thermally conductive filler such as aluminum nitride (AlN) or aluminum oxide ($Al_2O_3$), as necessary.

As the silicone rubber, from the viewpoint of alleviating a difference in thermal expansion due to a difference in temperature between the electrostatic chuck section and the temperature adjusting base section, silicone rubber having a condensation type or addition type reaction mechanism of one component and two components is preferable, and in general, silicone rubber which is represented by the following general formula (2) is used.

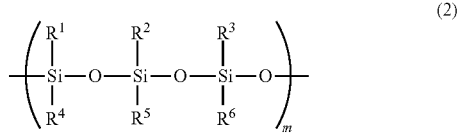

(2)

In the general formula (2), $R^1$ to $R^6$ each independently represent an alkyl group having 1 to 5 carbon atoms, an alkenyl group having 2 to 5 carbon atoms, or an aryl group having 6 to 12 carbon atoms, and some or all of hydrogen atoms of the alkyl group, the alkenyl group, and the aryl group may be substituted with fluorine atoms. m represents a repeating unit.

The alkyl group having 1 to 5 carbon atoms may be linear or branched, and a methyl group, an ethyl group, an n-propylisopropyl group, an n-butyl group, a t-butyl group, an n-pentyl group, or the like can be given as an example thereof. The number of carbon atoms of each of $R^1$ to $R^6$ is independently preferably in a range of 1 to 3, more preferably in a range of 1 to 2, and further preferably 1.

As the alkenyl group having 2 to 5 carbon atoms, a vinyl group, a 1-propenyl group, an allyl group, a 1-butenyl group, a 2-butenyl group, a pentenyl group, or the like can be given as an example.

As the aryl group having 6 to 12 carbon atoms, a phenyl group, a naphthyl group, or the like is exemplified, and it may have a substituent such as an alkyl group having 1 to 5 carbon atoms, or a halogen atom.

Some or all of the hydrogen atoms of the alkyl group, the alkenyl group, and the aryl group in the general formula (2) may be substituted with fluorine atoms. For example, if a propyl group is taken as an example, it may be a trifluoropropyl group (—$CH_2CH_2CF_3$) in which the hydrogen atom of the methyl group moiety at the terminal of the propyl group (—$CH_2CH_2CH_3$) is substituted with a fluorine atom.

Silicone resin is contained as a main component (70% by mass or more of the total mass of the silicone adhesive layer), whereby the silicone adhesive layer has heat resistance up to 200° C., has a high elongation as compared with an adhesive containing epoxy resin or polyimide resin as its main component, which is another heat-resistant adhesive, can relax the stress between the electrostatic chuck section and the temperature adjusting base section, and has high thermal conductivity, and therefore, it is preferable.

The silicone adhesive layer may be configured of a commercially available silicone adhesive (including a silicone adhesive compound), and a silicone adhesive compound (for example, SD 4580 PSA, SD 4584 PSA, SD 4585 PSA, SD 4587 L PSA, SD 4560 PSA, or the like) manufactured by Dow Corning Toray Co., Ltd., a silicone adhesive (for example, XE13-B3208, TSE3212, TSE3261-G, TSE3280-G, TSE3281-G, TSE3221, TSE326, TSE326M, TSE325, or the like) manufactured by Momentive Performance Materials Inc., a silicone adhesive (for example, KE-1820, KE-1823, KE-1825, KE-1830, KE-1833, or the like) manufactured by Shin-Etsu Chemical Co., Ltd., or the like can be given as an example.

[Sheet Material]

The sheet material is a member for relaxing stress which is caused by a difference in temperature between the electrostatic chuck section and the temperature adjusting base section, and from such a viewpoint, it is preferable that the sheet material contains any one which is selected from the group consisting of a silicone-based elastomer and a fluorine-based elastomer.

The silicone-based elastomer is an elastomer containing organopolysiloxane as its main component and is classified into a polydimethylsiloxane-based elastomer, a polymethylphenylsiloxane-based elastomer, and a polydiphenylsiloxane-based elastomer. There is also an elastomer partially denatured with a vinyl group, an alkoxy group, or the like. As a specific example, KE series (manufactured by Shin-Etsu Chemical Co., Ltd.), SE series, CY series, and SH series (all manufactured by Dow Corning Toray Silicone Co., Ltd.), or the like can be given.

As the fluorine-based elastomer, an elastomer having a structure in which a hard segment is fluorine-based resin and a soft segment is fluorine-based rubber, an elastomer in which the hydrogen atoms of some or all of hydrocarbon groups which are included in a silicone-based elastomer are substituted with fluorine atoms, or the like can be given as an example. The sheet material may include the silicone-based elastomer or the fluorine-based elastomer independently, may include two or more types, or may include all of one or more types of silicone-based elastomers and one or more types of fluorine-based elastomers.

It is preferable that the sheet material is thicker than the total layer thickness of the first adhesion layer and the second adhesion layer. Further, it is preferable that the thickness of the sheet material is in a range of 20 μm to 500 μm. The thickness of the sheet material is 20 μm or more, whereby it is easy to relax stress which is caused by a difference in temperature between the electrostatic chuck section and the temperature adjusting base section, and the thickness of the sheet material is 500 μm or less, whereby it is possible to suppress a decrease in the in-plane temperature uniformity of the electrostatic chuck section.

From the viewpoint of relaxing stress which is caused by a difference in temperature between the electrostatic chuck section and the temperature adjusting base section, it is preferable that the Shore hardness (A) of the sheet material is in a range of 20 to 80.

[Electrostatic Chuck Section]

The electrostatic chuck section has one principal surface serving as a placing surface on which a plate-shaped sample is placed, and has a built-in electrostatic attracting internal electrode.

More specifically, for example, it is preferable that the electrostatic chuck section is configured of a placing plate having an upper surface serving as a placing surface on which a plate-shaped sample such as a semiconductor wafer is placed, a supporting plate which is integrated with the placing plate and supports the placing plate, an electrostatic attracting internal electrode and an insulating material layer (an in-chuck insulating material layer) for insulating the surroundings of the electrostatic attracting internal electrode, which are provided between the placing plate and the supporting plate, and a power-feeding terminal which is provided so as to penetrate the supporting plate and applies a direct-current voltage to the electrostatic attracting internal electrode.

In the electrostatic chuck section, the surface adjacent to the first adhesion layer is the surface of supporting plate of the electrostatic chuck section.

The placing plate and the supporting plate have disk shapes in which the shapes of the superimposed surfaces are the same, and it is preferable that each of the placing plate and the supporting plate is made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminumnitride (AlN) sintered compact, or an yttrium oxide ($Y_2O_3$) sintered compact.

A configuration is preferable in which a plurality of protrusion portions each having a diameter smaller than the thickness of the plate-shaped sample are formed on the placing surface of the placing plate and support the plate-shaped sample.

It is preferable that the thickness of the electrostatic chuck section (the total thickness of the placing plate and the supporting plate) is in a range of 0.7 mm to 3.0 mm. The thickness of the electrostatic chuck section is 0.7 mm or more, whereby it is possible to secure the mechanical strength of the electrostatic chuck section. The thickness of the electrostatic chuck section is 3.0 mm or less, whereby heat transfer in a lateral direction of the electrostatic chuck section does not easily increase and a predetermined in-plane temperature distribution is easily obtained. Therefore, heat capacity does not easily increase and a thermal responsiveness is not easily degraded. The lateral direction of the electrostatic chuck section refers to the direction orthogonal to a laminating direction in the laminated configuration of the electrostatic chuck section, the first and second adhesion layers, the sheet material, and the temperature adjusting base section, as shown in FIG. 1.

The electrostatic attracting internal electrode is used as an electrostatic chuck electrode for generating electric charges and fixing the plate-shaped sample with an electrostatic attracting force, and the shape or size thereof is appropriately adjusted according to a use thereof.

The electrostatic attracting internal electrode is formed of conductive ceramic such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, or an aluminum nitride-tantalum (AlN—Ta) conductive compound sintered compact, or high melting point metal such as tungsten (W), tantalum (Ta), or molybdenum (Mo).

The thickness of the electrostatic attracting internal electrode is not particularly limited. However, the thickness of the electrostatic attracting internal electrode is preferably in a range of 0.1 µm to 100 µm and more preferably in a range of 5 µm to 20 µm. The thickness of the electrostatic attracting internal electrode is 0.1 µm or more, whereby it is possible to secure sufficient electrical conductivity, and the thickness is 100 µm or less, whereby it is difficult for the difference in coefficient of thermal expansion between the placing plate and the supporting plate, and the electrostatic attracting internal electrode, to become large, and it is difficult for cracks to occur in the joint interface between the placing plate and the supporting plate.

The electrostatic attracting internal electrode having such a thickness can be easily formed by a film formation method such as a sputtering method or a vapor deposition method, or a coating method such as a screen printing method.

The insulating material layer surrounds the electrostatic attracting internal electrode so as to protect the electrostatic attracting internal electrode from corrosive gas and plasma thereof, and joins and integrates a boundary portion between the placing plate and the supporting plate, that is, outer peripheral portion regions other than the electrostatic attracting internal electrode. It is preferable that the insulating material layer is configured of an insulating material having the same composition or the same main component as the materials configuring the placing plate and the supporting plate.

The power-feeding terminal is a rod-shaped member provided in order to apply a direct-current voltage to the electrostatic attracting internal electrode. A material of the power-feeding terminal is not particularly limited as long as it is an electrically conductive material having excellent heat resistance. However, a material having a coefficient of thermal expansion approximated to the coefficients thermal expansion of the electrostatic attracting internal electrode and the supporting plate is preferable, and for example, conductive ceramic configuring the electrostatic attracting internal electrode or a metal material such as tungsten (W), tantalum (Ta), molybdenum (Mo), niobium (Nb), or a kovar alloy is suitably used.

It is preferable that the power-feeding terminal is insulated from the temperature adjusting base section by an insulator having insulation properties.

Further, it is preferable that the power-feeding terminal is joined to and integrated with the supporting plate and the placing plate and the supporting plate are joined to and integrated with each other by the electrostatic attracting internal electrode and the insulating material layer, thereby configuring the electrostatic chuck section.

[Temperature Adjusting Base Section]

The temperature adjusting base section is a member for adjusting the temperature of the electrostatic chuck section a desired temperature, and the shape thereof is not particularly limited. However, usually, the temperature adjusting base section has a thick disk shape. It is preferable that the temperature adjusting base section is a water-cooled base or the like, in which a flow path for circulating water is formed inside thereof.

As a material configuring the temperature adjusting base section, metal which is excellent in thermal conductivity, electric conductivity, and workability, a compound material which includes the metal, or ceramic can be given as an example. Specifically, for example, aluminum (Al), an aluminum alloy, copper (Cu), a copper alloy, stainless steel (SUS), or the like is suitably used. It is preferable that at least the surface which is exposed to plasma, of the temperature adjusting base section, is subjected to alumite treatment or has an insulating film such as alumina formed thereon.

<Method of Manufacturing Electrostatic Chuck Device According to First Embodiment>

A method of manufacturing the electrostatic chuck device according to the first embodiment is not particularly limited as long as it is a method capable of forming the laminated configuration of the electrostatic chuck device according to the first embodiment of the present invention. However, in the formation of the joining layer, from the viewpoint of reducing the layer thickness of the joining layer, it is preferable to use a solution for a joining layer, which includes the compound for a joining layer, water, and as necessary, an organic solvent which dissolves the compound for a joining layer.

Specifically, a method in which the solution for a joining layer is applied to each of the surface of the electrostatic chuck section and the surface of the temperature adjusting base section, the surface with the solution for a joining layer applied thereto, of the electrostatic chuck section, is bonded to the surface on one side of the sheet material, and the surface with the solution for a joining layer applied thereto, of the temperature adjusting base section, is bonded to the surface on the other side of the sheet material; a method in which after the solution for a joining layer is applied to both surfaces of the sheet material, the electrostatic chuck section is bonded to the surface on one side of the sheet material and the temperature adjusting base section is bonded to the surface on the other side of the sheet material; or the like can be given as an example.

A solvent of the solution for a joining layer includes at least water and may further include an organic solvent which dissolves the compound for a joining layer. As the organic solvent, there is no particular limitation as long as it is an organic solvent capable of dissolving the compound for a joining layer, and at least one type which is selected from the group consisting of an alcohol and a ketone can be given as an example. As the alcohol, methanol, ethanol, isopropyl alcohol, or the like can be given as an example, and as the ketone, acetone, a methyl ethyl ketone, or the like can be given as an example.

As the solvent of the solution for a joining layer, among them, it is preferable to use a mixed solvent of alcohol and water, and it is more preferable to use a mixed solvent of isopropyl alcohol and water.

From the viewpoint of uniform application in a thin film, it is preferable that the solution for a joining layer is prepared in such a range that the concentration of the compound for a joining layer is in a range of 0.05% by mass to 5% by mass. It is more preferable that the concentration of the compound for a joining layer in the solution for a joining layer is in a range of 0.1% by mass to 1% by mass.

Further, the solution for a joining layer may include a catalyst in order to promote the hydrolysis of the compound for a joining layer. As the catalyst, a hydrochloric acid, a nitric acid, ammonia, or the like can be given as an example, and among them, a hydrochloric acid and ammonia are preferable.

From the viewpoint of suppressing the catalyst remaining in the electrostatic chuck device, it is preferable that the solution for a joining layer does not include a catalyst, and it is preferable that the solution for a joining layer includes a compound for a joining layer in which a reactive functional group is an epoxy group, an isocyanate group, an amino group, or a mercapto group, as the compound for a joining layer.

As a method of applying the solution for a joining layer to the electrostatic chuck section, the temperature adjusting base section, or the sheet material, application with spray or a brush, application with a bar coater, discharging by an inkjet method, or the like can be given as an example. Among them, from the viewpoint of easiness of adjustment of the layer thickness of the joining layer, application with a bar coater is preferable.

After the solution for a joining layer is applied to the electrostatic chuck section, the temperature adjusting base section, or the sheet material, it is preferable to remove the solvent by heating the surface with the solution for a joining layer applied thereto. By heating the surface with the solution for a joining layer applied thereto, it is possible to enhance the adhesiveness between the electrostatic chuck section, the temperature adjusting base section, or the sheet material and an adherend.

It is preferable that the heating of the surface with the solution for a joining layer applied thereto is performed under the conditions of a temperature in a range of 80° C. to 120° C. and a time in a range of 30 seconds to 5 minutes, although it depends on the thickness of the joining layer, the concentration of the compound for a joining layer in the solution for a joining layer, the type of the compound for the joining layer, or the like.

In a case where the silicone adhesive layer is provided in each of the first adhesion layer and the second adhesion layer, the silicone adhesive layer can be formed by applying a silicone adhesive to the electrostatic chuck section, the temperature adjusting base section, or the sheet material, and alternatively, the electrostatic chuck section with the solution for a joining layer applied thereto, the temperature adjusting base section with the solution for a joining layer applied thereto, or the sheet material with the solution for a joining layer applied thereto.

The silicone adhesive may be any one of a liquid adhesive having low viscosity, a liquid adhesive having high viscosity, and a solid adhesive. However, from the viewpoint of suppressing the solvent remaining in the electrostatic chuck device, it is preferable to use a liquid silicone adhesive which does not include a solvent.

In a case of using a solid silicone adhesive or a liquid silicone adhesive having high viscosity, from the viewpoint of easiness of application, a solution for an adhesive layer in which a silicone adhesive is dissolved in a solvent may be used.

As a method of applying the silicone adhesive or the solution for an adhesive layer, the same method as the method of applying the solution for a joining layer to the electrostatic chuck section, the temperature adjusting base section, or the like can be given as an example, and the preferred aspect is also the same. That is, application with a bar coater is preferable.

A solvent configuring the solution for an adhesive layer is not particularly limited as long as it is a solvent capable of dissolving the silicon adhesive, and at least one type which is selected from the group consisting of alcohol, a ketone, and water can be given as an example. As the alcohol, methanol, ethanol, isopropyl alcohol, or the like can be given as an example, and as the ketone, acetone, a methyl ethyl ketone, or the like can be given as an example. Among them, it is preferable to use ketone, and it is more preferable to use a methyl ethyl ketone.

It is favorable if the solution for an adhesive layer is prepared by diluting the silicone adhesive with a solvent to such an extent that the solution for an adhesive layer can be easily applied. Further, from the viewpoint of workability and solvent remaining suppression, it is preferable that the amount of the solvent is small, and the concentration of the silicone adhesive is preferably 20% by mass or more, and more preferably 30% by mass.

As a method of applying the solution for an adhesive layer to the electrostatic chuck section, the temperature adjusting base section, or the like, the same method as the method of applying the solution for a joining layer to the electrostatic chuck section, the temperature adjusting base section, or the like can be given as an example, and the preferred aspect is also the same. That is, application with a bar coater is preferable.

After the solution for an adhesive layer is applied to the electrostatic chuck section, the temperature adjusting base section, or the like, it is preferable to remove the solvent by heating the surface with the solution for an adhesive layer applied thereto. By heating the surface with the solution for an adhesive layer applied thereto, it is possible to enhance the adhesiveness between the electrostatic chuck section, the temperature adjusting base section, or the like and an adherend.

It is preferable that the heating of the surface with the solution for an adhesive layer applied thereto is performed under the conditions of a temperature in a range of 80° C. to 120° C. and a time in a range of 1 second to 7 minutes under ordinary pressure, although it depends on the thickness of the adhesive layer, the concentration of the silicone adhesive in the solution for an adhesive layer, the type of the silicone adhesive, or the like. Under reduced pressure, it is preferable to perform the heating with 50° C. as the upper limit.

Next, the laminated configuration of the electrostatic chuck section, the heating member, the first and second adhesion layers, the sheet material, and the base section in the electrostatic chuck device according to the second embodiment of the present invention will be described.

(2) Electrostatic Chuck Device According to Second Embodiment

Figure 2:
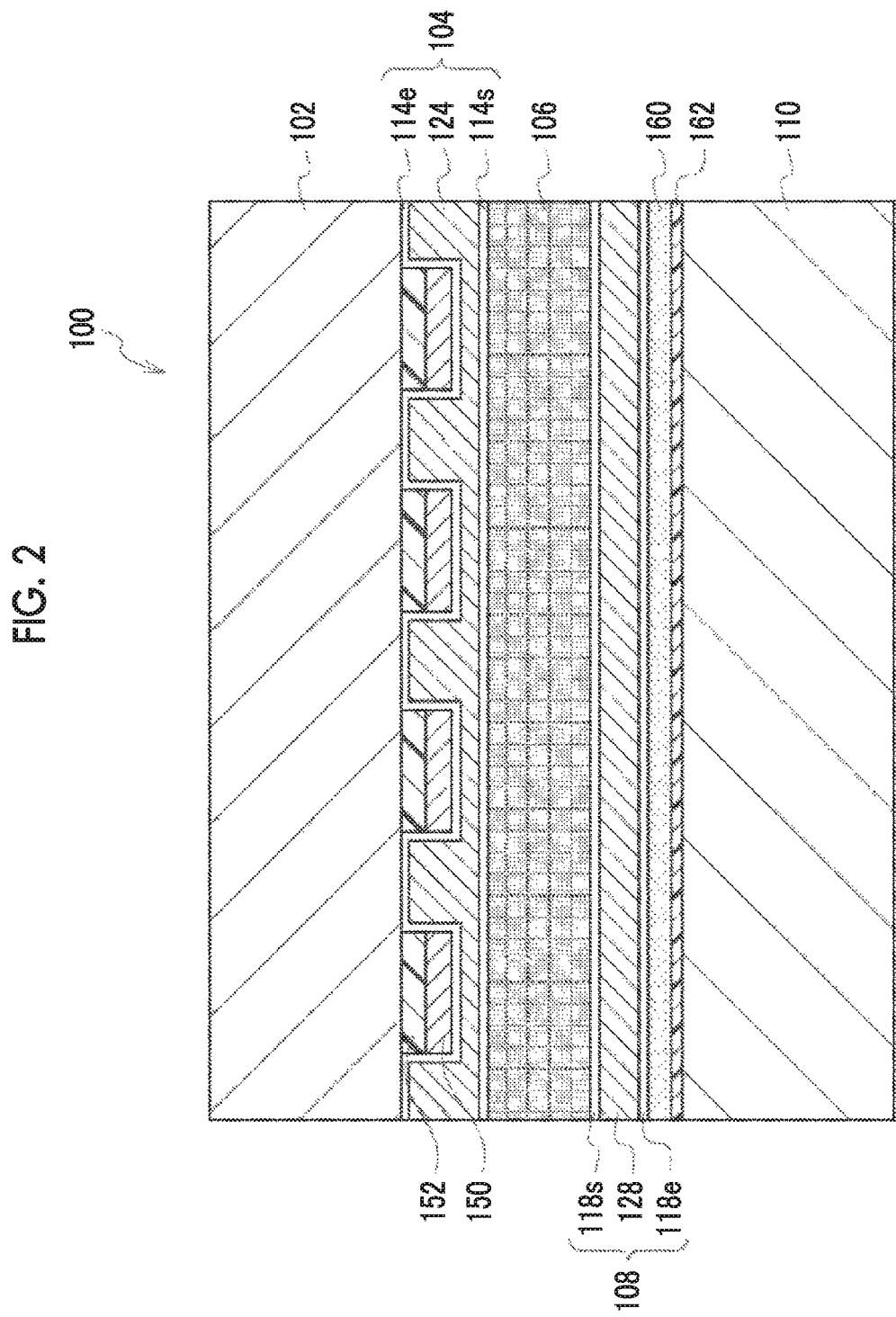
FIG. 2 is a cross-sectional schematic diagram showing an example of a laminated configuration of an electrostatic chuck device according to the present invention.

FIG. 2 is a cross-sectional schematic diagram showing an example of the laminated configuration of the electrostatic chuck device according to the second embodiment of the present invention.

An electrostatic chuck device 100 has an electrostatic chuck section 102 to which a wafer is fixed, a heating member 150 which heats the electrostatic chuck section 102, and a thick disk-shaped base section 110 having a function of cooling the electrostatic chuck section 102. An adhesive 152, the heating member 150, a first adhesion layer 104, a sheet material 106, a second adhesion layer 108, an insulating material layer 160, and an adhesive 162 are provided in order from the electrostatic chuck section 102 side between the electrostatic chuck section 102 and the base section 110.

The heating member 150 is located on the surface (referred to as a heating member installation surface) on the side opposite to a placing surface of the electrostatic chuck section 102 and fixed to the electrostatic chuck section 102 by the adhesive 152 in a pattern having a gap with respect to one another. The heating member 150 can be configured with a plurality of patterns in which, for example, a strip-shaped metal material having a narrow width is meandered. In FIG. 2, four heating members 150 are shown. However, the heating members 150 may be arranged in a single pattern or may be configured with a plurality of patterns of the same type or different types. For example, a plurality of annular heating members having different diameters may be disposed concentrically.

The first adhesion layer 104 in FIG. 2 is adjacent to the surface of the heating member 150 or the side surface of the heating member 150 at a location where the heating member 150 is present on the heating member installation surface of the electrostatic chuck section 102, and is adjacent to the electrostatic chuck section 102 at a location where there is no heating member 150.

The first adhesion layer 104 has a joining layer 114 and a silicone adhesive layer (a first silicone adhesive layer) 124. The first adhesion layer 104 in FIG. 2 has two joining layers 114 (114e and 114s). However, the first adhesion layer 104 may have only the joining layer 114e on the electrostatic chuck section 102 side or may have only the joining layer 114s on the sheet material 106 side. For example, a configuration is also acceptable in which the silicone adhesive layer 124 is located on one side of the electrostatic chuck section 102 side and the sheet material 106 side and the joining layer 114 is located on the other side.

Similarly, the second adhesion layer 108 has a joining layer 118 and a silicone adhesive layer (a second silicone adhesive layer) 128. The second adhesion layer 108 in FIG. 2 has two joining layers 118 (118e and 118s). However, the second adhesion layer 108 may have only the joining layer 118s on the sheet material 106 side or may have only the joining layer 118e on the base section 110 side. That is, for example, a configuration is also acceptable in which the silicone adhesive layer 128 is located on one side of the sheet material 106 side and the base section 110 side and the joining layer 118 is located on the other side.

Further, the electrostatic chuck device 100 has the insulating material layer 160 and the adhesion layer 162 fixing the insulating material layer 160 to the base section 110, between the second adhesion layer 108 and the base section 110.

In FIG. 2, the insulating material layer 160 is provided at a position adjacent to the base section 110. However, the position of the insulating material layer 160 is not particularly limited and may be provided between the heating member 150 and the electrostatic chuck section 102, between the heating member 150 and the sheet material 106, or the like.

Figure 3:
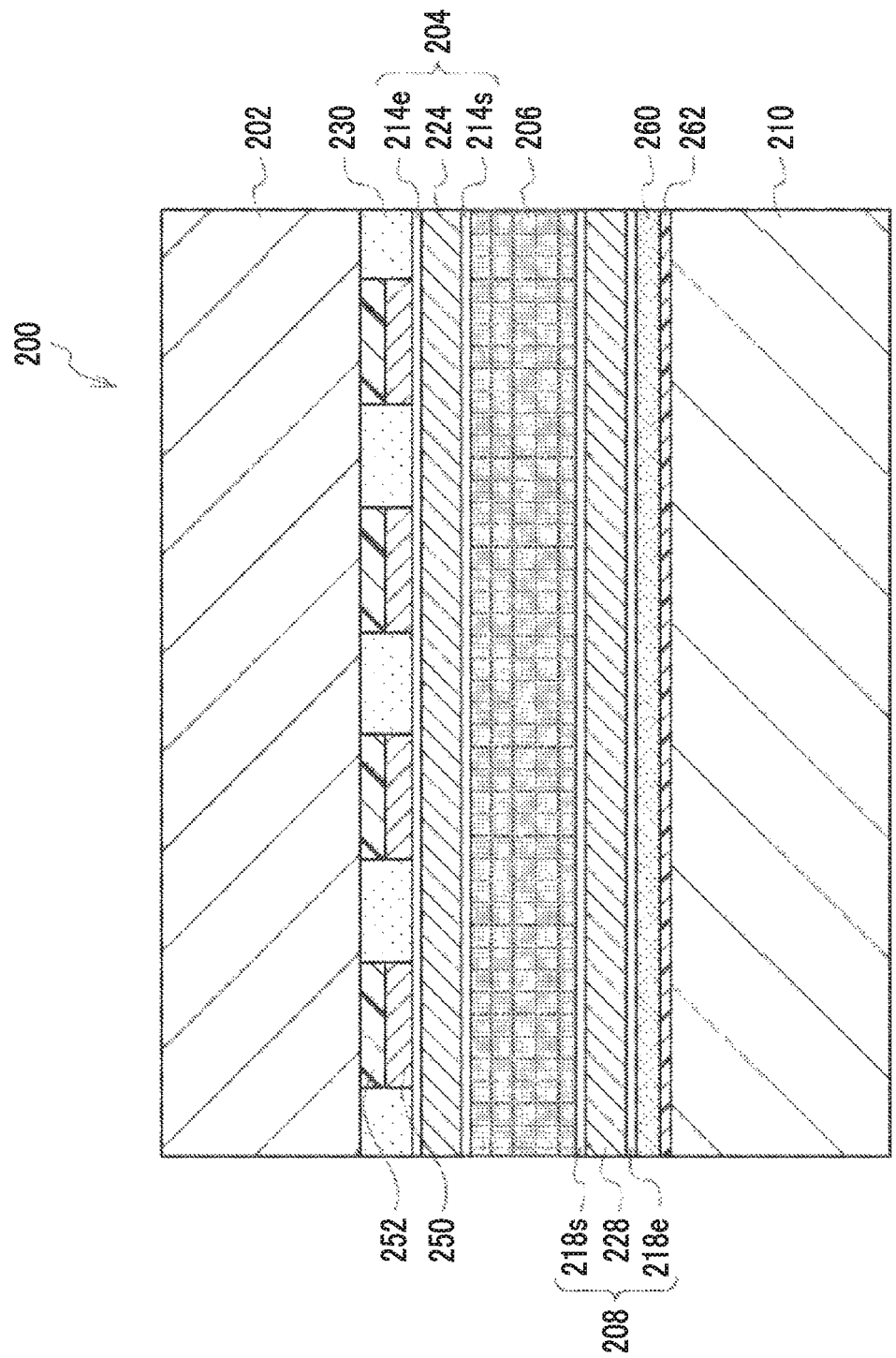
FIG. 3 is a cross-sectional schematic diagram showing another example of a laminated configuration of an electrostatic chuck device according to the present invention.

FIG. 3 is a cross-sectional schematic diagram showing another example of the laminated configuration of the electrostatic chuck device according to the second embodiment of the present invention.

An electrostatic chuck device 200 has an electrostatic chuck section 202 to which a wafer is fixed, a heating member 250 which heats the electrostatic chuck section 202, and a thick disk-shaped base section 210 having a function of cooling the electrostatic chuck section 202. An adhesive 252, the heating member 250, a first adhesion layer 204, a sheet material 206, a second adhesion layer 208, an insulating material layer 260, and an adhesive 262 are provided in order from the electrostatic chuck section 202 side between the electrostatic chuck section 202 and the base section 210. Further, at a position where a polymer material layer 230 is present, the polymer material layer 230, the first adhesion layer 204, the sheet material 206, the second adhesion layer 208, the insulating material layer 260, and the adhesive 262 are provided in order from the electrostatic chuck section 202 side between the electrostatic chuck section 202 and the base section 210. The adhesive 252 and the heating member 250, and the polymer material layer 230 are arranged in parallel on the surface (a heating member installation surface) on the side opposite to a placing surface of the electrostatic chuck section 202.

The electrostatic chuck section 202, the adhesive 252, the heating member 250, the sheet material 206, the second adhesion layer 208, the insulating material layer 260, the adhesive 262, and the base section 210 in the electrostatic chuck device 200 respectively have the same configurations as those of the electrostatic chuck section 102, the adhesive 152, the heating member 150, the sheet material 106, the second adhesion layer 108, the insulating material layer 160, the adhesive 162, and the base section 110 in the electrostatic chuck device 100, and therefore, description thereof is not repeated.

In the electrostatic chuck device 200, the heating members 250 are disposed on the surface (the heating member installation surface) on the side opposite to the placing surface of the electrostatic chuck section 202 in a pattern having a gap with respect to one another. The electrostatic chuck device 200 has the polymer material layer 230 filling up the gap of the heating member 250 (the gap between the heating members 250), on the heating member installation surface. The polymer material layer 230 is provided such that the shortest distance from the surface on which the heating member 250 is not provided within the heating member installation surface to the surface on the sheet material 206 side of the polymer material layer 230 and the shortest distance from the heating member installation surface to the surface on the sheet material 206 side of the heating member 250 are the same.

The shortest distance from the heating member installation surface to the surface on the sheet material 206 side of the polymer material layer 230 refers to the layer thickness of the polymer material layer 230 in a laminating direction of the electrostatic chuck device 200.

The electrostatic chuck device 200 has the polymer material layer 230, whereby unevenness due to the presence of the heating members 250 on the heating member installation surface is eliminated, and thus the first adhesion layer 204 is easily formed on the heating members 250.

Further, the polymer material layer 230 may further fill up the gap between an end portion on the heating member installation surface and the heating member 250.

The first adhesion layer 204 is provided adjacent to both surfaces of the surface on the sheet material 206 side of the heating member 250 and the surface on the sheet material 206 side of the polymer material layer 230.

The first adhesion layer 204 has a joining layer 214 and a silicone adhesive layer (a first silicone adhesive layer) 224. The first adhesion layer 204 in FIG. 3 has two joining layers 214 (214*e* and 214*s*). However, the first adhesion layer 204 may have only the joining layer 214*e* on the electrostatic chuck section 202 side or may have only the joining layer 214*s* on the sheet material 206 side. For example, a configuration is also acceptable in which the silicone adhesive layer 224 is located on one side of the electrostatic chuck section 202 side and the sheet material 206 side and the joining layer 214 is located on the other side.

The second adhesion layer 208 has a joining layer 218 and a silicone adhesive layer (a second silicone adhesive layer) 228. The second adhesion layer 208 in FIG. 3 has two joining layers 218 (218*e* and 218*s*). However, the second adhesion layer 208 may have only the joining layer 218*s* on the sheet material 206 side or may have only the joining layer 218*e* on the base section 210 side. That is, for example, a configuration is also acceptable in which the silicone adhesive layer 228 is located on one side of the sheet material 206 side and the base section 210 side and the joining layer 218 is located on the other side.

Figure 4:
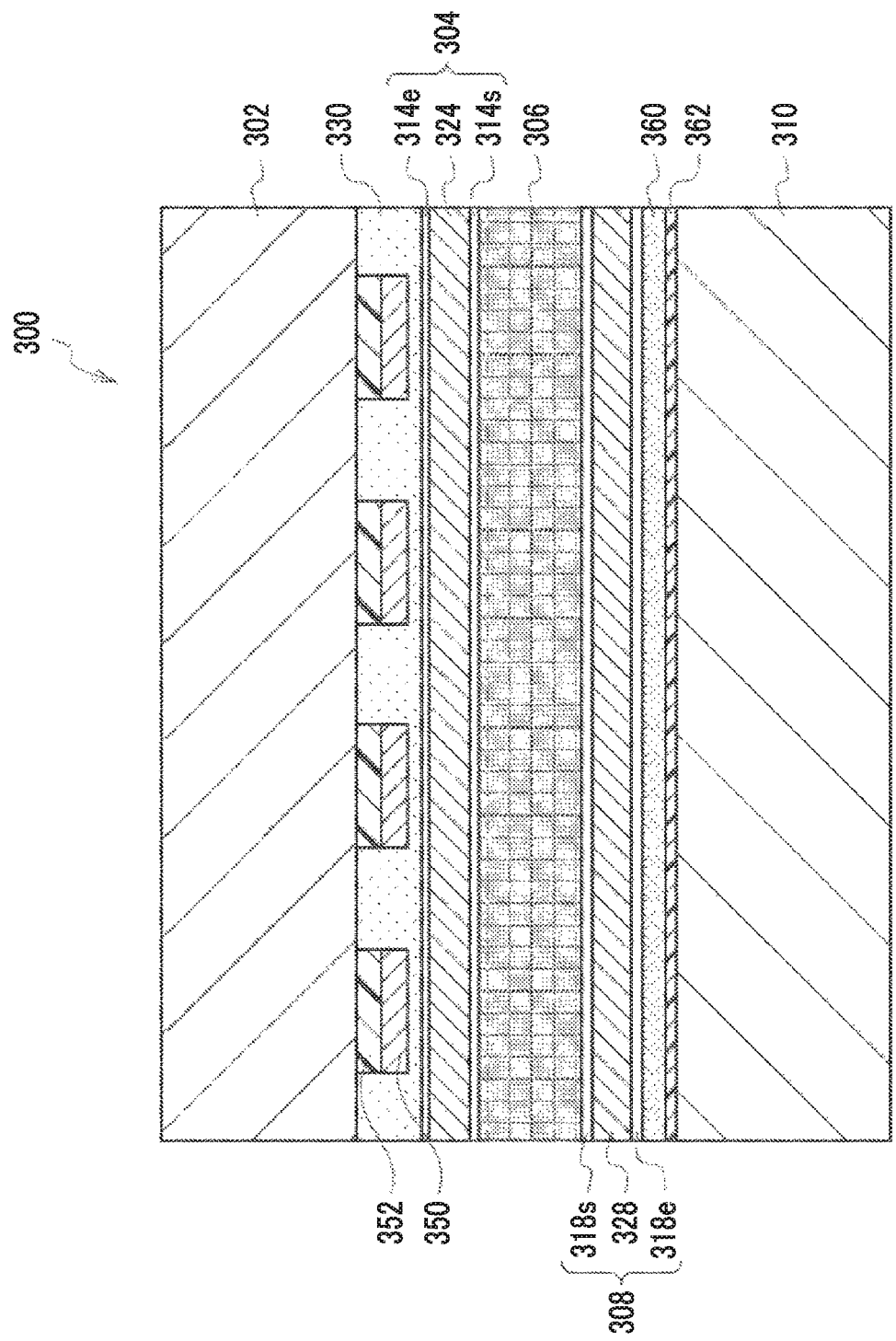
FIG. 4 is a cross-sectional schematic diagram showing another example of a laminated configuration of an electrostatic chuck device according to the present invention.

FIG. 4 is a cross-sectional schematic diagram showing another example of the laminated configuration of the electrostatic chuck device according to the second embodiment of the present invention.

An electrostatic chuck device 300 has an electrostatic chuck section 302 to which a wafer is fixed, a heating member 350 which heats the electrostatic chuck section 302, and a thick disk-shaped base section 310 having a function of cooling the electrostatic chuck section 302. An adhesive 352, the heating member 350, a polymer material layer 330, a first adhesion layer 304, a sheet material 306, a second adhesion layer 308, an insulating material layer 360, and an adhesive 362 are provided in order from the electrostatic chuck section 302 side between the electrostatic chuck section 302 and the base section 310.

The electrostatic chuck section 302, the adhesive 352, the heating member 350, the sheet material 306, the second adhesion layer 308, the insulating material layer 360, the adhesive 362, and the base section 310 in the electrostatic chuck device 300 respectively have the same configurations as those of the electrostatic chuck section 102, the adhesive 152, the heating member 150, the sheet material 106, the second adhesion layer 108, the insulating material layer 160, the adhesive 162, and the base section 110 in the electrostatic chuck device 100, and therefore, description thereof is omitted.

In the electrostatic chuck device 300, the heating members 350 are disposed on the surface (a heating member installation surface) on the side opposite to a placing surface of the electrostatic chuck section 302 in a pattern having a gap with respect to one another. The electrostatic chuck device 300 has a polymer material layer 330 filling up the gap of the heating member 350 (the gap between the heating members 350), on the heating member installation surface. The polymer material layer 330 fills up the gap between the heating members 350, covers the surfaces of the heating members 350 (the surfaces on the sheet material 306 side of the heating members 350), and has a flat surface.

The electrostatic chuck device 300 has the polymer material layer 330, whereby unevenness due to the presence of the heating members 350 on the heating member installation surface is eliminated and the first adhesion layer 304 is easily formed on the heating members 350.

The first adhesion layer 304 is provided adjacent to the surface on the sheet material 306 side of the polymer material layer 330.

The first adhesion layer 304 has a joining layer 314 and a silicone adhesive layer (a first silicone adhesive layer) 324. The first adhesion layer 304 in FIG. 4 has two joining layers 314 (314*e* and 314*s*). However, the first adhesion layer 304 may have only the joining layer 314*e* on the electrostatic chuck section 302 side or may have only the joining layer 314*s* on the sheet material 306 side. For example, a configuration is also acceptable in which the silicone adhesive layer 324 is located on one side of the electrostatic chuck section 302 side and the sheet material 306 side and the joining layer 314 is located on the other side.

The second adhesion layer 308 has a joining layer 318 and a silicone adhesive layer (a second silicone adhesive layer) 328. The second adhesion layer 308 in FIG. 4 has two joining layers 318 (318*e* and 318*s*). However, the second adhesion layer 308 may have only the joining layer 318*s* on the sheet material 306 side or may have only the joining layer 318*e* on the base section 310 side. That is, for example, a configuration is also acceptable in which the silicone adhesive layer 328 is located on one side of the sheet material 306 side and the base section 310 side and the joining layer 318 is located on the other side.

As described above, in the electrostatic chuck device 100 in FIG. 2, the joining layer 114 and the silicone adhesive layer 124 are interposed between the electrostatic chuck section 102 and the sheet material 106 and the joining layer 118 and the silicone adhesive layer 128 are interposed between the sheet material 106 and the base section 110. Therefore, it is considered that the adhesiveness between the electrostatic chuck section 102 and the base section 110 is excellent. Further, the layer thickness of each the joining layer 114 and the joining layer 118 is a thickness in a range of 1 nm to 500 nm, and each of the silicone adhesive layer 124 and the silicone adhesive layer 128 has a thickness in a range of 2 µm to 30 µm. Therefore, it is considered that variation in thermal conductivity from the base section 110 to the electrostatic chuck section 102 is suppressed and the in-plane temperature uniformity of the electrostatic chuck section 102 is excellent.

It is considered that the electrostatic chuck device 200 in FIG. 3 and the electrostatic chuck device 300 in FIG. 4 also operate in the same manner as the electrostatic chuck device 100 in FIG. 2.

The laminated configuration of the electrostatic chuck device according to the present invention is not limited to the configurations shown in FIGS. 2 to 4.

Hereinafter, description will be made with reference numerals omitted.

[Adhesion Layer, Joining Layer]

The electrostatic chuck device according to the second embodiment of the present invention is provided with the first adhesion layer which bonds the electrostatic chuck section and the sheet material together, and the second adhesion layer which bonds the sheet material and the base section together.

Further, the first adhesion layer includes the joining layer having a layer thickness in a range of 1 nm to 500 nm, and the silicone adhesive layer having a thickness in a range of 2 µm to 30 µm, and the second adhesion layer includes the joining layer having a layer thickness in a range of 1 nm to 500 nm, and the silicone adhesive layer having a thickness in a range of 2 µm to 30 µm. Each of the first adhesion layer and the second adhesion layer includes the joining layer having a layer thickness in a range of 1 nm to 500 nm and the silicone adhesive layer having a thickness in a range of 2 µm to 30 µm, whereby the adhesiveness between the electrostatic chuck section and the base section is excellent and the in-plane temperature uniformity of the electrostatic chuck section is excellent.

In a case where the silicone adhesive layer is present in both the gap between the heating members and the surface of the heating member, as in the electrostatic chuck device in FIG. 2, the "silicone adhesive layer having a thickness in a range of 2 µm to 30 µm" means that the maximum layer thickness of the layer thickness of the silicone adhesive layer in the laminating direction is in a range of 2 µm to 30 µm.

It is difficult to make the layer thickness of the joining layer smaller than the molecular size of a compound configuring the joining layer, and from such a viewpoint, the layer thickness is set to be 1 nm or more. Further, the layer thickness of the joining layer is set to be 500 nm or less, whereby the in-plane temperature uniformity of the electrostatic chuck section is excellent.

The layer thickness of the joining layer is preferably in a range of 2 nm to 300 nm and more preferably in a range of 2 nm to 150 nm.

Further, the joining layer may have a plurality of joining layers. However, from the viewpoint of the in-plane temperature uniformity of the electrostatic chuck section, it is preferable that the total layer thickness of the joining layers is 2000 nm or less.

Each of the first adhesion layer and the second adhesion layer has the silicone adhesive layer in addition to the joining layer. The adhesion layer further includes the silicone adhesive layer, whereby it is possible to strengthen the adhesion between the electrostatic chuck section and the sheet material and the adhesion between the sheet material and the base section.

Each of the first adhesion layer and the second adhesion layer may have each of the joining layer and the silicone adhesive layer in a single layer or may have it in two or more layers.

For example, a laminated configuration in which the first adhesion layer has the silicone adhesive layer, the first adhesion layer has two layers of joining layers, and the silicon adhesive layer is located between the joining layer on the electrostatic chuck section side and the joining layer on the sheet material side; and a laminated configuration in which the second adhesion layer has two layers of joining layers, the second silicone adhesive layer is located between the joining layer on the sheet material side and the joining layer on the base section side can be given as an example.

The first adhesion layer and the second adhesion layer may be the same or may be different from each other.

The joining layer is the same as the joining layer having the same configuration as the joining layer of the electrostatic chuck device according to the first embodiment, and the preferred aspect thereof is also the same.

The joining layer is formed using a compound for a joining layer, whereby the reactivity, the affinity, the close contact property, and the like between the compound for a joining layer, a component (for example, a sintered compact which includes aluminum) configuring the surface of the electrostatic chuck section, a component (for example, silicone resin) configuring the surface of the sheet material, and a component (for example, aluminum) configuring the surface of the base section are excellent, and as a result, it is easy to reduce the layer thickness of the joining layer.

The compound for a joining layer, which is used for the formation of the joining layer, is the same as the compound for a joining layer described in the description of the electrostatic chuck device according to the first embodiment, and as the compound for a joining layer, the compound for a joining layer further having a hydrolyzable group, or the like is included, and the preferred aspect thereof is also the same. A solution for a joining layer can also be used in the same manner as the solution for a joining layer of the electrostatic chuck device according to the first embodiment.

(Silicone Adhesive Layer)

Each of the first adhesion layer and the second adhesion layer further has the silicone adhesive layer. As described previously, the adhesion layer further includes the silicone adhesive layer, whereby it is possible to further strengthen the adhesion between the electrostatic chuck section and the sheet material and the adhesion between the sheet material and the base section.

The thickness of the silicone adhesive layer is the same as that of the silicone adhesive layer of the electrostatic chuck device according to the first embodiment, and the preferred aspect thereof is also the same.

The position of the silicone adhesive layer is not limited as long as it is within the adhesion layer.

For example, a configuration in which the first silicone adhesive layer is located on one side of the electrostatic chuck section side and the sheet material side and the joining layer is on the other side, or a configuration in which the second silicone adhesive layer is located on one side of the sheet material side and the base section side and the joining layer is on the other side is also acceptable.

Further, the silicone adhesive layer may be located between two joining layers, as described as a laminated configuration in which the adhesion layer includes two or more joining layers.

The component configuration of the silicone adhesive layer is the same as the component configuration of the silicone adhesive layer of the electrostatic chuck device according to the first embodiment, and the preferred aspect thereof is also the same.

The silicone adhesive layer contains silicone rubber as its main component (70% by mass or more of the total mass of the silicone adhesive layer), whereby it has heat resistance up to 200° C., has a high elongation as compared with an adhesive containing epoxy resin, polyimide resin, or the like as its main component, which is another heat-resistant adhesive, can relax the stress between the electrostatic chuck section and the base section, and has high thermal conductivity, and therefore, it is preferable.

[Sheet Material]

The sheet material is a member for relaxing stress which is caused by a difference in temperature between the electrostatic chuck section and the base section.

The sheet material is the same as the sheet material of the electrostatic chuck device according to the first embodiment, and the preferred aspect thereof is also the same.

It is preferable that the sheet material is thicker than the total layer thickness of the first adhesion layer and the second adhesion layer. Further, it is preferable that the thickness of the sheet material is in a range of 20 μm to 500 μm. The thickness of the sheet material is 20 μm or more, whereby it is easy to relax stress which is caused by a difference in temperature between the electrostatic chuck section and the base section, and the thickness of the sheet material is 500 μm or less, whereby it is possible to suppress a decrease in the in-plane temperature uniformity of the electrostatic chuck section.

From the viewpoint of relaxing stress which is caused by a difference in temperature between the electrostatic chuck section and the base section, it is preferable that the Shore hardness (A) of the sheet material is in a range of 20 to 80.

[Electrostatic Chuck Section]

The electrostatic chuck section is the same as the electrostatic chuck section of the electrostatic chuck device according to the first embodiment, and the preferred aspect thereof is also the same. In the electrostatic chuck device according to the second embodiment, the lateral direction of the electrostatic chuck section refers to a direction orthogonal to the laminating direction in the laminated configuration of the electrostatic chuck section, the first and second adhesion layers, the sheet material, and the base section, as shown in FIG. 2. Further, it is preferable that the power-feeding terminal is insulated from the base section by an insulator having insulation properties.

[Heating Member]

The heating member is located on the surface on the side opposite to the placing surface of the electrostatic chuck section and fixed to the electrostatic chuck section by an adhesive in a pattern having a gap with respect to one another.

The form of the heating member is not particularly limited. However, it is preferable that the heating member is a heater element composed of two or more heater patterns independent of each other.

The heater element can be configured of, for example, two heaters independent of each other; an inner heater formed at a center portion of the surface (a heating member installation surface) on the side opposite to the placing surface of the electrostatic chuck section, and an outer heater annularly formed outside a peripheral edge portion of the inner heater. Each of the inner heater and the outer heater can have a single continuous strip-shaped heater pattern formed by repeatedly disposing a meandering pattern of a narrow strip-shaped metal material around the center axis of the heating member installation surface with the center axis as the center and connecting the patterns adjacent to each other.

By independently controlling each of the inner heater and the outer heater, it is possible to accurately control the in-plane temperature distribution of the plate-shaped sample fixed to the placing surface of the placing plate of the electrostatic chuck section by electrostatic attraction.

It is preferable that the heater element is formed by etching a nonmagnetic metal thin plate, for example, a titanium (Ti) thin plate, a tungsten (W) thin plate, a molybdenum (Mo) thin plate, or the like, having a constant thickness of 0.2 mm or less and preferably 0.1 mm or less, in a desired heater pattern by a photolithography method.

The thickness of the heater element is 0.2 mm or less, whereby it is difficult for the pattern shape of the heater element to be reflected as the temperature distribution of the plate-shaped sample and it becomes easy to maintain the in-plane temperature of the plate-shaped sample at a desired temperature pattern.

Further, if the heater element is formed of nonmagnetic metal, even if the electrostatic chuck device is used in a high frequency atmosphere, it is difficult for the heater element to cause self-heating due to a high frequency and it becomes easy to maintain the in-plane temperature of the plate-shaped sample at a desired constant temperature or a desired constant temperature pattern.

Further, if the heater element is formed using a nonmagnetic metal thin plate having a constant thickness, the thickness of the heater element becomes constant over the entire heating surface and the amount of heat generation also becomes constant over the entire heating surface. Therefore, it is possible to uniformize a temperature distribution in the placing surface of the electrostatic chuck section.

As the adhesive (an adhesive for a heating member) for fixing the heating member to the surface on the side opposite to the placing surface of the electrostatic chuck section, it is preferable to use a sheet-shaped or film-shaped adhesive resin having heat resistance and insulating properties, such as polyimide resin, silicone resin, or epoxy resin.

The thickness of the adhesive for a heating member is preferably in a range of 5 μm to 100 μm and more preferably in a range of 10 μm to 50 μm. From the viewpoint of enhancing the in-plane uniformity of heat which is transmitted the heating member to the electrostatic chuck section, it is preferable that variation in the in-plane thickness of the adhesive for a heating member is within 10 μm.

[Polymer Material Layer]

It is preferable that the electrostatic chuck device has a polymer material layer filling up the gap between the heating members.

The layer thickness in the laminating direction of the electrostatic chuck device of the polymer material layer which is located on the surface on which the heating member is not provided, of the surface (the heating member installation surface) on the side opposite to the placing surface of the electrostatic chuck section, is at least the same thickness as the shortest distance from the heating member installation surface to the surface on the sheet material side of the heating member. In a case where the surface of the heating member (the surface on the sheet material side of the heating member) is covered with the polymer material layer, from the viewpoint of the in-plane temperature uniformity of the electrostatic chuck section, the layer thickness of the polymer material layer on the surface of the heating member (the distance from the surface of the heating member installation surface to the surface on the sheet material side of the heating member) is preferably in a range of 1 μm to 100 μm and more preferably in a range of 1 μm to 25 μm.

As a polymer material which can configure the polymer material layer, heat-resistant resin such as polyimide resin, a silicone adhesive (silicone rubber), silicone resin, fluorine-based resin, room temperature vulcanizing (RTV) rubber, fluorine silicone rubber, or the like can be given as an example. Only one type among these materials may be used, or two or more types may be used.

Among the above, from the viewpoint of heat resistance, heat-resistant resin such as polyimide resin, a silicone adhesive, fluorine resin, and fluorine silicone rubber are preferable, and polyimide resin, a silicone adhesive, and fluorine resin are more preferable. Further, the silicone adhesive (silicone rubber) is preferably in a liquid state.

[Insulating Material Layer]

It is preferable that the electrostatic chuck device according to the second embodiment has an insulating material layer for covering at least a part of the base section.

The electrostatic chuck device according to the second embodiment of the present invention has the heating member for heating the electrostatic chuck section, and therefore, it is preferable to have the insulating material layer in order to suppress the conduction (short-circuit defect) between the electrostatic chuck section and the base section and improve the withstand voltage property of the base section.

It is acceptable if the insulating material layer covers at least a part of the base section. However, it is preferable that the insulating material layer is a film-shaped or sheet-shaped layer covering the entirety of the base section.

Further, it is acceptable if the position of the insulating material layer is located between the electrostatic chuck section and the base section, and the insulating material layer may be configured in not only a single layer but also a plurality of layers. For example, the insulating material layer may be provided at a position adjacent to the base section, between the heating member and the electrostatic chuck section, between the heating member and the sheet material, or the like.

Among the above, from the viewpoint of easiness of the formation of the insulating material layer, it is preferable that the insulating material layer is provided at a position adjacent to the base section between the heating member and the base section.

In a case of fixing the insulating material layer to the base section, it is preferable that the insulating material layer is fixed to the upper surface of the base section through an adhesive. The adhesive (an adhesive for an insulating material layer) which is used for the fixing of the insulating material layer is not particularly limited, and sheet-shaped or film-shaped adhesive resin having heat resistance and insulation properties, such as polyimide resin, silicone resin, or epoxy resin, can be used. The thickness of the adhesive for an insulating material layer is preferably in a range of 5 μm to 100 μm and more preferably in a range of 10 μm to 50 μm. From the viewpoint of enhancing the in-plane uniformity of the temperature control of the electrostatic chuck section by the base section, it is preferable that variation in the in-plane thickness of the adhesive for an insulating material layer is within 10 μm.

From the viewpoint of temperature adjustment of the electrostatic chuck section, the thermal conductivity of the insulating material layer is preferably in a range of 0.05 W/mk or more and 0.5 W/mk or less and more preferably in a range of 0.1 W/mk or more and 0.25 W/mk or less.

[Base Section]

The base section is a member having a function of cooling the electrostatic chuck section and adjusting the temperature of the electrostatic chuck section heated by the heating member to a desired temperature, and also has a function of lowering heat generation caused by etching or the like of the plate-shaped sample fixed to the electrostatic chuck section.

The shape of the base section is not particularly limited. However, usually, it is a thick disk shape. It is preferable that the base section is a water-cooled base or the like, in which a flow path for circulating water is formed inside thereof.

As a material configuring the base section, metal which is excellent in thermal conductivity, electric conductivity, and workability, a compound material which includes the metal, or ceramic can be given as an example. Specifically, for example, aluminum (Al), an aluminum alloy, copper (Cu), a copper alloy, stainless steel (SUS), or the like is suitably used. It is preferable that at least the surface which is exposed to plasma, of the base section, is subjected to alumite treatment or has an insulating film such as alumina formed thereon.

<Method of Manufacturing Electrostatic Chuck Device According to Second Embodiment>

A method of manufacturing the electrostatic chuck device according to the second embodiment is not particularly limited as long as it is a method capable of forming the laminated configuration of the electrostatic chuck device according to the second embodiment of the present invention. However, in the formation of the joining layer, from the viewpoint of reducing the layer thickness of the joining layer, it is preferable to use the solution for a joining layer, which includes the compound for a joining layer, water, and as necessary, an organic solvent which dissolves the compound for a joining layer.

In the manufacturing of the electrostatic chuck device according to the second embodiment, it is preferable that the heating member is fixed to the heating member installation surface of the electrostatic chuck section in advance by the adhesive for a heating member.

Further, it is preferable that a polymer material fills up a recess portion formed by the electrostatic chuck section and the heating member such that the heights of the polymer material layer and the heating member are aligned with each other, as in the electrostatic chuck device shown in FIG. 3, or that the recess portion and the heating member are covered with a polymer material such that the surface of the polymer material layer is made flat, as in the electrostatic chuck device shown in FIG. 4.

In a case where the electrostatic chuck device is provided with the insulating material layer, it is preferable to fix the insulating material layer to the base section with an adhesive (an adhesive for an insulating material layer).

With respect to the heating member, individual heating members may be fixed to the heating member installation surface in a pattern having a gap with respect to one another, and alternatively, after a film-shaped or plate-shaped heating member is stuck to the heating member installation surface, a part of the heating member may be removed by etching or the like so as to expose the heating member installation surface, thereby forming a gap.

Hereinafter, the electrostatic chuck section will be described with a configuration in which the heating members are fixed to the heating member installation surface in advance, the gap between the heating members is filled with the polymer material, and the polymer material layer is formed by covering the heating member with the polymer material, as a representative. In the following description, in a configuration in which the electrostatic chuck section does not have the polymer material layer, as in FIG. 2, the "surface of the polymer material layer" may be read to be replaced by the "heating member installation surface and the side surface and the surface of the heating member". In a configuration in which the electrostatic chuck section has the polymer material layer, as in FIG. 3, and the thickness of the polymer material layer is the same as the height of the heating member, the "surface of the polymer material layer" may be read to be replaced by the "surface of the polymer material layer and the surface of the heating member".

Further, the base section will be described with a configuration in which the insulating material layer is not fixed thereto, as a representative. In the following description, in a configuration in which the insulating material layer is fixed to the base section, the "surface of the base section" may be read to be replaced by the "surface of the insulating material layer".

In the manufacturing of the electrostatic chuck device according to the second embodiment, specifically, a method in which the solution for a joining layer is applied to each of the surface of the polymer material layer of the electrostatic chuck section, the sheet material, and the surface of the base section, the surface with the solution for a joining layer applied thereto, of the polymer material layer, is bonded to the surface on one side of the sheet material, and the surface with the solution for a joining layer applied thereto, of the base section, is bonded to the surface on the other side of the sheet material; a method in which after the solution for a joining layer is applied to both surfaces of the sheet material, the surface of the polymer material layer is bonded to the surface on one side of the sheet material and the surface of the base section is bonded to the surface on the other side of the sheet material; or the like can be given as an example.

The solution for a joining layer and the solvent thereof are the same as the solution for a joining layer and the solvent thereof described in the description of the manufacturing of the electrostatic chuck device according to the first embodiment, and the preferred aspects thereof are also the same.

Further, in the formation of the polymer material layer, it is preferable to use a solution for a polymer material layer, which includes a polymer material and a solvent which dissolves the polymer material.

As the solvent which dissolves the polymer material, although it depends on the type of the polymer material, a methyl ethyl ketone, a methyl isobutyl ketone, cyclohexanone, or the like can be given as an example, and for example, in a case where polyimide resin is used as the polymer material, it is preferable to use a methyl ethyl ketone as the solvent.

Although it depends on the type of the polymer material which is used, a method of applying the solution, or the like, for example, in a case of application with spin coating, from the viewpoint of uniform application, the concentration of the polymer material in the solution for a polymer material layer is set to be preferably in a range of 0.05% by mass to 5% by mass and more preferably in a range of 0.1% by mass to 1% by mass. Further, in a case where an application method is screen printing, from the viewpoint of easiness of printing, the concentration of the polymer material in the solution for a polymer material layer is set to be preferably in a range of 30% by mass to 70% by mass and more preferably 40% by mass to 60% by mass.

As a method of applying the solution for a joining layer to the electrostatic chuck section, the heating member, the polymer material layer, the insulating material layer, the base section, or the sheet material, in addition of the application with screen printing and the application with spin coating described above, application with spray, a brush, or a bar coater, discharge by an inkjet method, or the like can be given as an example. Among them, from the viewpoint of easiness of adjustment of the layer thickness of the joining layer, application with a bar coater is preferable.

In a case where unevenness by the electrostatic chuck section and the heating member is on the electrostatic chuck section, as in the laminated configuration of the electrostatic chuck device shown in FIG. 2, it is preferable to apply the solution for a joining layer by spray application or application with a brush.

As a method of applying the solution for a polymer material layer to the surface of the electrostatic chuck section and the side surface or the surface of the heating member, spray application or application with a brush is preferable.

After the solution for a joining layer is applied to the electrostatic chuck section, the base section, or the sheet material, it is preferable to remove the solvent by heating the surface with the solution for a joining layer applied thereto. By heating the surface with the solution for a joining layer applied thereto, it is possible to enhance the adhesiveness between the electrostatic chuck section, the base section, or the sheet material and an adherend.

It is preferable that the heating of the surface with the solution for a joining layer applied thereto is performed under the conditions of a temperature in a range of 80° C. to 120° C. and a time in a range of 30 seconds to 5 minutes, although it depends on the thickness of the joining layer, the concentration of the compound for a joining layer in the solution for a joining layer, the type of the compound for the joining layer, or the like.

In a case where the silicone adhesive layer is provided in each of the first adhesion layer and the second adhesion layer, the silicone adhesive layer can be formed by applying a silicone adhesive to the electrostatic chuck section, the base section, or the sheet material, and alternatively, the electrostatic chuck section with the solution for a joining layer applied thereto, the base section with the solution for a joining layer applied thereto, or the sheet material with the solution for a joining layer applied thereto.

The silicone adhesive may be any one of a liquid adhesive having low viscosity, a liquid adhesive having high viscosity, and a solid adhesive. However, from the viewpoint of suppressing the solvent remaining in the electrostatic chuck device, it is preferable use a liquid silicone adhesive which does not include a solvent.

In a case of using a solid silicone adhesive or a liquid silicone adhesive having high viscosity, from the viewpoint of easiness of application, a solution for an adhesive layer in which a silicone adhesive is dissolved in a solvent may be used.

As a method of applying the silicone adhesive or the solution for an adhesive layer, the same method as the method of applying the solution for a joining layer to the electrostatic chuck section, the base section, or the like can be given as an example, and the preferred aspect is also the same. That is, application with a bar coater is preferable.

In a case of applying the silicone adhesive to the recess portion formed by the electrostatic chuck section and the heating member, as in the laminated configuration of the electrostatic chuck device shown in FIG. 2, it is preferable to apply the silicone adhesive by a screen printing method.

The solution for an adhesive layer and the solvent configuring the solution are the same as the solution for an adhesive layer and the solvent configuring the solution described in the description of the manufacturing of the electrostatic chuck device according to the first embodiment, and the preferred aspects thereof are also the same.

As a method of applying the solution for an adhesive layer to the electrostatic chuck section, the base section, or the like, the same method as the method of applying the solution for a joining layer to the electrostatic chuck section, the base section, or the like can be given as an example, and the preferred aspect is also the same. That is, application with a bar coater is preferable.

After the solution for an adhesive layer is applied to the electrostatic chuck section, the base section, or the like, it is preferable to remove the solvent by heating the surface with the solution for an adhesive layer applied thereto. By heating the surface with the solution for an adhesive layer applied thereto, it is possible to enhance the adhesiveness between the electrostatic chuck section, the base section, or the like and an adherend.

It is preferable that the heating of the surface with the solution for an adhesive layer applied thereto is performed under the conditions of a temperature in a range of 80° C. to 120° C. and a time in a range of 1 second to 7 minutes under ordinary pressure, although it depends on the thickness of the adhesive layer, the concentration of the silicone adhesive in the solution for an adhesive layer, the type of the silicone adhesive, or the like. Under reduced pressure, it is preferable to perform the heating with 50° C. as the upper limit.

Further, in the electrostatic chuck devices according to the first and second embodiments, it is preferable that the electrostatic chuck section is manufactured as follows.

First, the plate-shaped placing plate and the plate-shaped supporting plate are fabricated by using an aluminum oxide-silicon carbide ($Al_2O_3$—$SiC$) compound sintered compact. In this case, each of the placing plate and the supporting plate can be obtained by forming mixed powder which includes silicon carbide powder and aluminum oxide powder into a desired shape and thereafter, performing calcination for a predetermined time at a temperature in a range of 1600° C. to 2000° C., for example, and under a non-oxidative atmosphere, preferably, an inert atmosphere.

Subsequently, a plurality of fixing holes for fitting and holding the power-feeding terminals therein are formed in the supporting plate.

The power-feeding terminal is fabricated so as to have a size and a shape in which the terminal can be fixed in close contact with the fixing hole of the supporting plate. As a method of fabricating the power-feeding terminal, for example, in a case where the power-feeding terminal is made of a conductive compound sintered compact, a method in which conductive ceramic powder is formed into a desired shape and pressed and calcinated, or the like can be given as an example.

At this time, as the conductive ceramic powder which is used for the power-feeding terminal, conductive ceramic powder made of the same material as the electrostatic attracting internal electrode is preferable.

Further, in a case where the power-feeding terminal is made of metal, high melting point metal is used, and a method of forming it by a metal working method such as a grinding method or a powder metallurgy, or the like can be given as an example.

Subsequently, a coating liquid for formation of the electrostatic attracting internal electrode, in which a conductive material such as the conductive ceramic powder is dispersed in an organic solvent which includes terpineol, ethyl cellulose, and the like, is applied to a predetermined area of the surface of the supporting plate with the power-feeding terminals fitted therein, so as to comes into contact with the power-feeding terminals, and dried, thereby forming an electrostatic attracting internal electrode forming layer.

As the application method, it is desirable to use a screen printing method or the like, because it is necessary to apply the coating liquid in a uniform thickness. Further, as other methods, there are a method of forming a thin film of the high meting point metal by a vapor deposition method or a sputtering method, a method of forming an electrostatic attracting internal electrode forming layer by disposing a thin plate made of the conductive ceramic or high meting point metal, and the like.

Further, an insulating material layer which includes a powder material having the same composition or the same main component as the placing plate and the supporting plate is formed at an area except for the area in which the electrostatic attracting internal electrode forming layer is formed, on the supporting plate, in order to improve insulation properties, corrosion resistance, and plasma resistance. The insulating material layer can be formed, for example, by applying a coating liquid in which insulating material powder having the same composition or the same main component as the placing plate and the supporting plate is dispersed in an organic solvent which includes terpineol, ethyl cellulose, and the like, to the predetermined area by screen printing or the like, and drying it.

Subsequently, the placing plate is superimposed on the electrostatic attracting internal electrode forming layer and the insulating material layer on the supporting plate, and subsequently, these are integrated together by hot calender work under a high temperature and high pressure. It is preferable that an atmosphere in this hot calender work is vacuum or an inert atmosphere such as Ar, He, $N_2$, or the like. Further, the pressure is preferably in a range of 5 to 10 MPa, and the temperature is preferably in a range of 1600° C. to 1850° C.

The electrostatic attracting internal electrode forming layer is calcinated by the hot calender, whereby the electrostatic attracting internal electrode made of a conductive compound sintered compact is obtained. At the same time, the supporting plate and the placing plate are joined to and integrated with each other with the insulating material layer interposed therebetween.

Further, the power-feeding terminals are re-calcinated by a hot calender under a high temperature and high pressure and fixed in close contact with the fixing holes of the supporting plate.

Then, the electrostatic chuck section is obtained by machining the upper and lower surfaces, the outer periphery, a gas hole, and the like of the joined body.

The aspects of the electrostatic chuck device according to the first embodiment are disclosed in the following <a1> to <a7>.

According to the first embodiment of the present invention, an electrostatic chuck device is provided in which the adhesiveness between an electrostatic chuck section and a temperature adjusting base section is excellent and the in-plane temperature uniformity of the electrostatic chuck section is excellent.

<a1> An electrostatic chuck device including: an electrostatic chuck section having one principal surface serving as a placing surface on which a plate-shaped sample is placed, and having a built-in electrostatic attracting internal electrode; a first adhesion layer; a sheet material; a second adhesion layer; and a temperature adjusting base section which adjusts a temperature of the electrostatic chuck section to a desired temperature, in this order, in which the first adhesion layer includes a joining layer having a layer thickness in a range of 1 nm to 500 nm, and a silicone adhesive layer having a thickness in a range of 2 µm to 30 µm, and the second adhesion layer includes a joining layer having a layer thickness in a range of 1 nm to 500 nm, and a silicone adhesive layer having a thickness in a range of 2 µm to 30 µm.

<a2> The electrostatic chuck device according to the above <a1>, in which the joining layer is a layer having a structure derived from a compound having at least one reactive functional group which is selected from the group consisting of an epoxy group, an isocyanate group, an amino group, a mercapto group, a vinyl group, a styryl group, a methacryl group, an acryl group, an ureido group, a sulfide group, and an isocyanurate group.

<a3> The electrostatic chuck device according to the above <a2>, in which the compound having the reactive functional group further has a hydrolyzable group.

<a4> The electrostatic chuck device according to the above <a3>, in which the compound having the reactive functional group is represented by the following general formula (1).

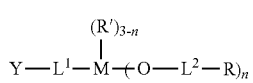
(1)

[In the general formula (1), Y represents an epoxy group, an isocyanate group, an amino group, a mercapto group, a vinyl group, a styryl group, a methacryl group, an acryl group, an ureido group, a sulfide group, or an isocyanurate group, $L^1$ represents a linking group, M represents a silicon atom, a titanium atom, or a zirconium atom, R represents an alkyl group having 1 to 5 carbon atoms, $L^2$ represents a single bond or carbonyl, n represents an integer of 1, 2, or 3, and $R^1$ represents an alkyl group having 1 to 3 carbon atoms, or a phenyl group.]

<a5> The electrostatic chuck device according to any one of the above <a1> to <a4>, in which the sheet material is thicker than the total layer thickness of the first adhesion layer and the second adhesion layer, and a thickness of the sheet material is in a range of 20 µm to 500 µm.

<a6> The electrostatic chuck device according to any one of the above <a1> to <a5>, in which the sheet material contains any one which is selected from the group consisting of a silicone-based elastomer and a fluorine-based elastomer.

<a7> The electrostatic chuck device according to any one of the above <a1> to <a6>, in which the placing surface is composed of an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

The aspects of the electrostatic chuck device according to the second embodiment are disclosed in the following <b1> to <b10>.

According to the second embodiment of the present invention, an electrostatic chuck device is provided in which the adhesiveness between an electrostatic chuck section and a base section is excellent and the in-plane temperature uniformity of the electrostatic chuck section is excellent.

<b1> An electrostatic chuck device including: an electrostatic chuck section having one principal surface serving as a placing surface on which a plate-shaped sample is placed, and having a built-in electrostatic attracting internal electrode; a plurality of heating members bonded to a surface on the side opposite to the placing surface of the electrostatic chuck section in a pattern having a gap with respect to one another; a first adhesion layer; a sheet material; a second adhesion layer; and a base section having a function of cooling the electrostatic chuck section, in this order, in which the first adhesion layer includes a joining layer having a layer thickness in a range of 1 nm to 500 nm, and a silicone adhesive layer having a thickness in a range of 2 µm to 30 µm, and the second adhesion layer includes a joining layer having a layer thickness in a range of 1 nm to 500 nm, and a silicone adhesive layer having a thickness in a range of 2 µm to 30 µm.

<b2> The electrostatic chuck device according to the above <b1>, further including: a polymer material layer filling up the gap between the heating members, in which a layer thickness of the polymer material layer is the same as the shortest distance from the surface on the side opposite to the placing surface of the electrostatic chuck section to a surface on the first adhesion layer side of the heating member.

<b3> The electrostatic chuck device according to the above <b1>, further including: a polymer material layer filling up the gap between the heating members and covering surfaces of the heating members, in which a surface of the polymer material layer is flat.

<b4> The electrostatic chuck device according to any one of the above <b1> to <b3>, further including: an insulating material layer provided between the heating members and the base section.

<b5> The electrostatic chuck device according to any one of the above <b1> to <b4>, in which the joining layer is a layer having a structure derived from a compound having at least one reactive functional group which is selected from a group consisting of an epoxy group, an isocyanate group, an amino group, a mercapto group, a vinyl group, a styryl group, a methacryl group, an acryl group, an ureido group, a sulfide group, and an isocyanurate group.

<b6> The electrostatic chuck device according to the above <b5>, in which the compound having the reactive functional group further has a hydrolyzable group.

<b7> The electrostatic chuck device according to the above <b6>, in which the compound having the reactive functional group is represented by the following general formula (1).

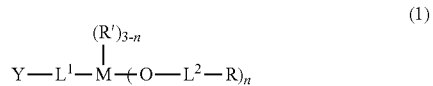
(1)

In the general formula (1), Y represents an epoxy group, an isocyanate group, an amino group, a mercapto group, a vinyl group, a styryl group, a methacryl group, an acryl group, an ureido group, a sulfide group, or an isocyanurate group, and L represents a linking group. M represents a silicon atom, a titanium atom, or a zirconium atom. R represents an alkyl group having 1 to 5 carbon atoms, $L^2$ represents a single bond or carbonyl, and n represents an integer of 1, 2, or 3. R' represents an alkyl group having 1 to 3 carbon atoms, or a phenyl group.

<b8> The electrostatic chuck device according to any one of the above <b1> to <b7>, in which the sheet material is thicker than the total layer thickness of the first adhesion layer and the second adhesion layer, and a thickness of the sheet material is in a range of 20 µm to 500 µm.

<b9> The electrostatic chuck device according to any one of the above <b1> to <b8>, in which the sheet material contains any one which is selected from the group consisting of a silicone-based elastomer and a fluorine-based elastomer.

<b10> The electrostatic chuck device according to any one of the above <b1> to <b9>, in which the placing surface is composed of an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

EXAMPLE

Hereinafter, the present invention will be described using examples. However, the present invention is not limited to these examples.

Examples and comparative examples relating to the electrostatic chuck device according to the first embodiment are shown in Examples a1 to a25 and Comparative Examples a1 to a4, and examples and comparative examples relating to the electrostatic chuck device according to the second embodiment are shown in Examples b1 to b19 and Comparative Examples b1 to b4.

<<Examples and Comparative Examples Relating to Electrostatic Chuck Device According to First Embodiment>>

In Examples a1 to a25 and Comparative Examples a1 to a4 below, the electrostatic chuck section and the temperature adjusting base section were replaced with base materials which will be described later, and a laminated body was obtained by manufacturing a laminated body of a base material 1, the first adhesion layer, the sheet material, the second adhesion layer, and a base material 2.

<1. Raw Material>

The base material, the compound for a joining layer, the adhesive layer, and the sheet material used in the manufacturing of each of the laminated bodies of Examples a1 to a25 and Comparative Examples a1 to a4 are shown in Table 2. The details of each material are as follows.

[Base Material]
A: polyimide film
  Kapton 300H (manufactured by Du Pont-Toray Co., Ltd.), area: 30 mm×30 mm, thickness: 75 μm
B: metal piece
  Aluminum jig (diameter: 40 mm), thickness: 2 cm

[Compound for Joining Layer]

For the compounds for a joining layer, silane coupling agents having product numbers shown in Table 2 and manufactured by Shin-Etsu Chemical Co., Ltd. were used. Each silane coupling agent has a reactive functional group shown in Table 2.

Except for that specified in Table 1, isopropyl alcohol (IPA), a predetermined amount of water, and a catalyst were added to the silane coupling agent, and hydrolysis was performed under heating at 60° C., whereby the solution for a joining layer was obtained.

(Preparation of Solution for Joining Layer)

The solution for a joining layer was prepared by mixing the components shown in Table 1 in blending amounts shown in Table 1.

However, in the solutions for a joining layer using silane coupling agents (compounds for a joining layer A, B, C and D in Table 2) in which the reactive functional group is an amino group, an epoxy group, a mercapto group, or an isocyanate group, a catalyst was not used (the blending amount of a catalyst was 0% by mass).

The blending amount of a catalyst in the solutions for a joining layer using silane coupling agents (compounds for a joining layer E, F, and G in Table 2) in which the reactive functional group is a vinyl group, an acryl group, or a methacryl group was set to be 0.5% by mass.

TABLE 1

| Component | Blending amount |
| --- | --- |
| Silane coupling agent shown in Table 2 | a % by mass [10% by mass] |
| Water | b % by mass [triple molar quantity with respect to silane coupling agent] |
| Catalyst (hydrochloric acid, 1 normal) | c % by mass [0.5% by mass] |
| Isopropyl alcohol | Residue [(100 − (a + b + c)) % by mass] |

[Silicone Adhesive Layer]
A: silicone adhesive KE-1820 manufactured by Shin-Etsu Silicone Co., Ltd.

The silicone adhesive layer was used as the solution for an adhesive layer obtained by diluting the above silicone adhesive with a methyl ethyl ketone to a concentration of 30% by mass.

[Sheet Material]
A: Sμ-100-50 manufactured by SANSIN ENTERPRISE CO., LTD., thickness: 100 μm, Shore hardness (A): 50

TABLE 2

| Type | Base material (product name) | Compound for joining layer/ reactive functional group (product name) | Adhesive layer | Sheet material |
| --- | --- | --- | --- | --- |
| A | Polyimide (Kapton 300H) | Silane coupling agent/ amino group (KBM-903) | Silicone adhesive | 100 μm Hardness 50 |
| B | Aluminum jig | Silane coupling agent/ epoxy group (KBM-403) | — | 100 μm Hardness 70 |
| C | — | Silane coupling agent/ mercapto group (KBM-803) | — | 200 μm Hardness 20 |
| D | — | Silane coupling agent/ isocyanate group (KBE-9007) | — | — |
| E | — | Silane coupling agent/ vinyl group (KBM-1003) | — | — |
| F | — | Silane coupling agent/ acryl group (KBM-5103) | — | — |
| G | — | Silane coupling agent/ methacryl group (KBM-503) | — | — |

<2. Manufacturing of Laminated Body>

Examples a1 to a21 and Comparative Examples a1 to a3

The solution for a joining layer, which includes a silane coupling agent of the type shown in Table 3, was applied to one surface of the base material 1 of the type shown in Table 3 by using a bar coater so as to have a film thickness shown in Table 3, and heating was performed at 100° C. for 1 minute. Similarly, the solution for a joining layer, which includes a silane coupling agent of the type shown in Table 3, was applied to one surface of the base material 2 of the type shown in Table 3 by using a bar coater so as to have a film thickness shown in Table 3, and heating was performed at 100° C. for 1 minute.

The solution for an adhesive layer was applied to the surface of the joining layer on the base material 1 by using bar coater so as to have a film thickness shown in Table 3. Similarly, the solution for an adhesive layer was applied to the surface of the joining layer on the base material 2 by using bar coater so as to have a film thickness shown in Table 3.

A laminated body was obtained by bonding the surface on one side of the sheet material of the type shown in Table 3 to the surface with the solution for an adhesive layer applied thereto, of the base material 1, bonding the surface on the other side of the sheet material to the surface with the solution for an adhesive layer applied thereto, of the base material 2, and performing heating at 100° C. for 3 minutes.

Example a22

The solution for a joining layer, which includes a silane coupling agent of the type shown in Table 3, was applied to both surfaces of the sheet material of the type shown in Table 3 by using a bar coater so as to have a film thickness shown in Table 3, and heating was performed at 100° C. for 1 minute. The sheet material having the surfaces with the solution for a joining layer applied thereto, on both surfaces, obtained in this way, is hereinafter referred to as a "sheet material 2".

A laminated body was obtained in the same manner as in the manufacturing of the laminated body of Example a1, except that the sheet material 2 prepared in advance was used instead of the sheet material used in Example a1.

Example a23

The solution for an adhesive layer was applied to one surface of the base material 1 of the type shown in Table 3 by using bar coater so as to have a film thickness shown in Table 3. Similarly, the solution for an adhesive layer was applied to one surface of the base material 2 by using bar coater so as to have a film thickness shown in Table 3.

A laminated body was obtained by bonding the surface on one side of the sheet material 2 to the surface with the solution for an adhesive layer applied thereto, of the base material 1, bonding the surface on the other side of the sheet material 2 to the surface with the solution for an adhesive layer applied thereto, of the base material 2, and performing heating at 100° C. for 3 minutes.

Example a24

The solution for a joining layer, which includes a silane coupling agent of the type shown in Table 3, was applied to one surface of the sheet material of the type shown in Table 3 by using a bar coater so as to have a film thickness shown in Table 3, and heating was performed at 100° C. for 1 minute. The sheet material having the surfaces with the solution for a joining layer applied thereto, on one surface, obtained in this way, is hereinafter referred to as a "sheet material 3".

The solution for a joining layer, which includes a silane coupling agent of the type shown in Table 3, was applied to one surface of the base material 1 of the type shown in Table 3 by using a bar coater so as to have a film thickness shown in Table 3, and heating was performed at 100° C. for 1 minute. Subsequently, the solution for an adhesive layer was applied to the surface of the joining layer on the base material 1 by using bar coater so as to have a film thickness shown in Table 3.

On the other hand, the solution for an adhesive layer was applied to one surface of the base material 2 of the type shown in Table 3 by using bar coater so as to have a film thickness shown in Table 3, without applying the solution for a joining layer.

A laminated body was obtained by bonding the surface to which the solution for a joining layer is not applied, of the sheet material 3, to the surface with the solution for an adhesive layer applied thereto, of the base material 1, bonding the surface with the solution for a joining layer applied thereto, of the sheet material 3, to the surface with the solution for an adhesive layer applied thereto, of the base material 2, and performing heating at 100° C. for 3 minutes.

Example a25

The solution for an adhesive layer was applied to one surface of the base material 1 of the type shown in Table 3 by using bar coater so as to have a film thickness shown in Table 3, without applying the solution for a joining layer. On the other hand, the solution for a joining layer, which includes a silane coupling agent of the type shown in Table 3, was applied to one surface of the base material 2 of the type shown in Table 3 by using a bar coater so as to have a film thickness shown in Table 3, and heating was performed at 100° C. for 1 minute. Subsequently, the solution for an adhesive layer was applied to the surface of the joining layer on the base material 2 by using bar coater so as to have a film thickness shown in Table 3.

A laminated body was obtained by bonding the surface on one side of the sheet material 2 to the surface with the solution for an adhesive layer applied thereto, of the base material 1, bonding the surface on the other side of the sheet material 2 to the surface with the solution for an adhesive layer applied thereto, of the base material 2, and performing heating at 100° C. for 3 minutes.

Comparative Example a4

The solution for an adhesive layer was applied to one surface of the base material 1 of the type shown in Table 3 by using bar coater so as to have a film thickness shown in Table 3. Similarly, the solution for an adhesive layer was applied to one surface of the base material 2 by using bar coater so as to have a film thickness shown in Table 3.

A laminated body was obtained by bonding the surface on one side of the sheet material of the type shown in Table 3 to the surface with the solution for an adhesive layer applied thereto, of the base material 1, bonding the surface on the other side of the sheet material to the surface with the solution for an adhesive layer applied thereto, of the base material 2, and performing heating at 100° C. for 3 minutes.

<3. Evacuation Method>

1. Peeling Strength

With respect to each of the laminated bodies of Examples a1 to a25 and Comparative Examples a1 to a4, heating and pressurization were performed at 160° C. for 12 hours while applying a load of 10 kg, whereby a test piece for peeling strength evaluation was made.

The base material 2 was peeled off from the base material 1 of the test piece by the hand, and the destruction state of the peeled surface was visually observed and evaluated according to the following criteria.

A: Very strong adhesive strength (cohesive failure)
B: Strong adhesive strength (interfacial failure: the degree of a gum tape)
C: Bonded with very weak adhesion (interfacial failure: the degree of a cellphane tape)
D: Not bonded 2. Film Thickness Fluctuation The total layer thicknesses at five places in each of the laminated bodies of Examples a1 to a25 and Comparative Examples a1 to a4 were measured using Film thickness meter VL-50A manufactured by Mitutoyo Corporation. Among the obtained measurement results, the difference between the layer thickness of the place having the largest layer thickness and the layer thickness of the place having the smallest layer thickness was set to be a film thickness fluctuation, and a case where the film thickness fluctuation is 10 μm or more was evaluated to be C and a case where the film thickness fluctuation is less than 10 μm was evaluated to be A.

The film thickness fluctuation serves as an index of the in-plane temperature uniformity of a wafer which is fixed to the electrostatic chuck device, and in a case where the film thickness fluctuation is less than 10 μm, the in-plane temperature uniformity of the electrostatic chuck section is excellent.

TABLE 3

|  | Base material 1 | First adhesion layer ||||| Sheet material |
|  |  | Joining layer 1E || Adhesive layer 1 || Joining layer 1S ||  |
|  | Type | Type | Thickness | Type | Thickness | Type | Thickness | Type |
| Example a1 | A | A | 3 nm | A | 3 μm | — | — | A |
| Example a2 | A | A | 20 nm | A | 3 μm | — | — | A |
| Example a3 | A | A | 100 nm | A | 3 μm | — | — | A |
| Example a4 | A | A | 500 nm | A | 3 μm | — | — | A |
| Comparative Example a1 | A | A | 1000 nm | A | 3 μm | — | — | A |
| Comparative Example a2 | A | A | 20 nm | A | 1 μm | — | — | A |
| Example a5 | A | A | 20 nm | A | 2 μm | — | — | A |
| Example a6 | A | A | 20 nm | A | 10 μm | — | — | A |
| Example a7 | A | A | 20 nm | A | 30 μm | — | — | A |
| Comparative Example a3 | A | A | 20 nm | A | 50 μm | — | — | A |
| Example a8 | A | A | 20 nm | A | 3 μm | — | — | A |
| Example a9 | A | B | 20 nm | A | 3 μm | — | — | A |
| Example a10 | A | C | 20 nm | A | 3 μm | — | — | A |
| Example a11 | A | D | 20 nm | A | 3 μm | — | — | A |
| Example a12 | A | E | 20 nm | A | 3 μm | — | — | A |
| Example a13 | A | F | 20 nm | A | 3 μm | — | — | A |
| Example a14 | A | G | 20 nm | A | 3 μm | — | — | A |
| Example a15 | B | A | 20 nm | A | 3 μm | — | — | A |
| Example a16 | B | B | 20 nm | A | 3 μm | — | — | A |
| Example a17 | B | C | 20 nm | A | 3 μm | — | — | A |
| Example a18 | B | D | 20 nm | A | 3 μm | — | — | A |
| Example a19 | B | E | 20 nm | A | 3 μm | — | — | A |
| Example a20 | B | F | 20 nm | A | 3 μm | — | — | A |
| Example a21 | B | G | 20 nm | A | 3 μm | — | — | A |
| Example a22 | A | A | 20 nm | A | 3 μm | A | 20 nm | A |
| Example a23 | A | — | — | A | 3 μm | A | 20 nm | A |
| Example a24 | A | A | 20 nm | A | 3 μm | — | — | A |
| Example a25 | A | — | — | A | 3 μm | A | 20 nm | A |
| Comparative Example a4 | A | — | — | A | 3 μm | — | — | A |

|  | Second adhesion layer |||||| Base material 2 | Evaluation ||
|  | Joining layer 2S || Adhesive layer 2 || Joining layer 2E ||  | Peeling strength | Film thickness fluctuation |
|  | Type | Thickness | Type | Thickness | Type | Thickness | Type |  |  |
| Example a1 | — | — | A | 3 μm | A | 3 nm | A | B | A |
| Example a2 | — | — | A | 3 μm | A | 20 nm | A | A | A |
| Example a3 | — | — | A | 3 μm | A | 100 nm | A | A | A |
| Example a4 | — | — | A | 3 μm | A | 500 nm | A | B | A |
| Comparative Example a1 | — | — | A | 3 μm | A | 1000 nm | A | C | A |
| Comparative Example a2 | — | — | A | 1 μm | A | 20 nm | A | D | A |
| Example a5 | — | — | A | 2 μm | A | 20 nm | A | A | A |
| Example a6 | — | — | A | 10 μm | A | 20 nm | A | A | A |
| Example a7 | — | — | A | 30 μm | A | 20 nm | A | A | A |

TABLE 3-continued

| | | | | | | | | | |
|---|---|---|---|---|---|---|---|---|---|
| Comparative Example a3 | — | — | A | 50 μm | A | 20 nm | A | A | C |
| Example a8 | — | — | A | 3 μm | A | 20 nm | A | A | A |
| Example a9 | — | — | A | 3 μm | B | 20 nm | A | A | A |
| Example a10 | — | — | A | 3 μm | C | 20 nm | A | B | A |
| Example a11 | — | — | A | 3 μm | D | 20 nm | A | B | A |
| Example a12 | — | — | A | 3 μm | E | 20 nm | A | B | A |
| Example a13 | — | — | A | 3 μm | F | 20 nm | A | B | A |
| Example a14 | — | — | A | 3 μm | G | 20 nm | A | B | A |
| Example a15 | — | — | A | 3 μm | A | 20 nm | A | B | A |
| Example a16 | — | — | A | 3 μm | B | 20 nm | A | A | A |
| Example a17 | — | — | A | 3 μm | C | 20 nm | A | B | A |
| Example a18 | — | — | A | 3 μm | D | 20 nm | A | A | A |
| Example a19 | — | — | A | 3 μm | E | 20 nm | A | B | A |
| Example a20 | — | — | A | 3 μm | F | 20 nm | A | B | A |
| Example a21 | — | — | A | 3 μm | G | 20 nm | A | B | A |
| Example a22 | A | 20 nm | A | 3 μm | A | 20 nm | A | A | A |
| Example a23 | A | 20 nm | A | 3 μm | — | — | A | A | A |
| Example a24 | A | 20 nm | A | 3 μm | — | — | A | A | A |
| Example a25 | A | 20 nm | A | 3 μm | A | 20 nm | A | A | A |
| Comparative Example a4 | — | — | A | 3 μm | — | — | A | C | A |

From Table 3, in the laminated bodies of the examples having the joining layer with a layer thickness in a range of 1 to 500 nm, both the adhesiveness evaluation and the film thickness fluctuation evaluation were high. Therefore, if the electrostatic chuck device each having the laminated configurations of the examples is made, it is expected that the adhesiveness between the electrostatic chuck section and the temperature adjusting base section is excellent and the in-plane temperature uniformity of the electrostatic chuck section is excellent.

<<Examples and Comparative Examples Relating to Electrostatic Chuck Device According to Second Embodiment>>

In Examples b1 to b19 and Comparative Examples b1 to b4 below, laminated bodies similar to the laminated configuration of the electrostatic chuck device shown in FIG. 4 were made and evaluated.

<1. Configurations of Laminated Bodies of Examples b1 to b19 and Comparative Examples b1 to b4>

Each of the laminated bodies of Examples b1 to b19 and Comparative Examples b1 to b4 has a configuration in which the electrostatic chuck section 302, the adhesive 352, the heating member 350, the polymer material layer 330, the first adhesion layer 304, the sheet material 306, the second adhesion layer 308, and the base section 310 in FIG. 4 are laminated in this order. However, the laminated bodies of some of the comparative examples do not have one or both of the first adhesion layer 304 and the second adhesion layer 308.

The laminated bodies of Examples b1 to b19 and Comparative Examples b1 to b4 are not provided with the insulating material layer 360 and the adhesive 362 in FIG. 4.

In Examples b1 to b19 and Comparative Examples b1 to b4, a laminated body of the electrostatic chuck section 302, the adhesive 352, the heating member 350, and the polymer material layer 330 in FIG. 4 is referred to as a "base material 1", and the base section 310 is referred to as a base material 2.

<2. Raw Material>

The base material, the compound for a joining layer, the adhesive layer (the silicone adhesive layer), and the sheet material used in the manufacturing of each of the laminated bodies of Examples b1 to b19 and Comparative Examples b1 to b4 are shown in Table 5. The details of each material are as follows.

[Base Material]

With respect to the base material 1, two types of base materials; a base material type A in which the polymer material of the polymer material layer is a silicone adhesive (TSE 3221; silicone rubber, manufactured by Momentive Performance Materials, Inc.), and a base material type B in which the polymer material is polyimide resin (Q-IP-1022E manufactured by PI R&D Co., Ltd.), were prepared.

As the base material 2, an aluminum jig (diameter: 40 mm, thickness: 2 cm; base material type C) was used.

(Making of Base Material 1)

Ti foil (a heating member) was bonded to a ceramic plate ($Al_2O_3$—SiC compound sintered compact) serving as an electrostatic chuck section, through TSE 3221 (manufactured by Momentive Performance Materials, Inc.) as an adhesive for a heating member. Subsequently, a Ti pattern in which annular Ti foils having different diameters were concentrically disposed was formed by exposing a part of the ceramic plate by etching the Ti foil.

A polymer material solution was applied to the ceramic plate having a concavo-convex surface formed due to the Ti pattern, by screen printing, thereby forming a flat polymer material layer in the recess portions between the Ti foils and on the Ti foil. The layer thickness of the polymer material layer was set to be a thickness in which the distance from the surface of the ceramic plate (the heating member installation surface) to the surface of the polymer material layer is 100 μm, and a thickness in which the distance from the surface of the Ti foil to the surface of the polymer material layer is 20 μm.

The concentration of the polymer material in the solution for a polymer material layer used for the formation of the polymer material layer was set to be 50% by mass (solvent: methyl ethyl ketone).

[Compound for Joining Layer]

For the compounds for a joining layer, silane coupling agents having product numbers shown in Table 5 and manufactured by Shin-Etsu Chemical Co., Ltd. were used. Each silane coupling agent has a reactive functional group shown in Table 4. Except for that (Example b14) specified in Table 6, isopropyl alcohol (IPA), a predetermined amount of water, and a catalyst were added to the silane coupling agent, and hydrolysis was performed under heating at 60° C., whereby the solution for a joining layer was obtained.

In Example b14, a solution for a joining layer in which heating at 60° C. was not performed and hydrolysis was not performed was used.

(Preparation of Solution for Joining Layer)

The solution for a joining layer was prepared by mixing the components shown in Table 5 in blending amounts shown in Table 4.

However, in the solutions for a joining layer using silane coupling agents (compounds for a joining layer A, B, C and D in Table 5) in which the reactive functional group is an amino group, an epoxy group, a mercapto group, or an isocyanate group, a catalyst was not used (the blending amount of a catalyst was 0% by mass).

The blending amount of a catalyst in the solutions for a joining layer using silane coupling agents (compounds for a joining layer E, F, and G in Table 5) in which the reactive functional group is a vinyl group, an acryl group, or a methacryl group was set to be 0.5% by mass.

TABLE 4

| Component | Blending amount |
| --- | --- |
| Silane coupling agent shown in Table 5 | a % by mass [10% by mass] |
| Water | b % by mass [triple molar quantity with respect to silane coupling agent] |
| Catalyst (hydrochloric acid, 1 normal) | c % by mass [0 or 0.5% by mass] |
| Isopropyl alcohol | Residue [(100 − (a + b + c)) % by mass] |

[Silicone Adhesive Layer]

A: silicone adhesive TSE3221 manufactured by Momentive Performance Materials Japan, LLC.

The silicone adhesive layer was used as the solution for an adhesive layer obtained by diluting the above silicone adhesive with a methyl ethyl ketone to a concentration of 30% by mass.

[Sheet Material]

A: Sp-100-50 manufactured by SANSIN ENTERPRISE CO., LTD., thickness: 100 μm, Shore hardness (A): 50

TABLE 5

| Type | Base material 1/Base material 2 | Compound for joining layer/ reactive functional group (product name) | Adhesive layer | Sheet material |
| --- | --- | --- | --- | --- |
| A | Ceramic plate (filling with silicone adhesive) | Silane coupling agent/ amino group (KBM-903) | Silicone adhesive (TSE3221) | 100 μm Hardness 50 |
| B | Ceramic plate (filling with polyimide resin) | Silane coupling agent/ epoxy group (KBM-403) | — | — |
| C | Aluminum jig | Silane coupling agent/ mercapto group (KBM-803) | — | — |
| D | — | Silane coupling agent/ isocyanate group (KBE-9007) | — | — |
| E | — | Silane coupling agent/ vinyl group (KBM-1003) | — | — |
| F | — | Silane coupling agent/ acryl group (KBM-5103) | — | — |
| G | — | Silane coupling agent/ methacryl group KBM-503 | — | — |

<3. Manufacturing of Laminated Body>

Examples b1 to b14 and Comparative Examples b1 to b3

The solution for a joining layer, which includes a silane coupling agent of the type shown in Table 6, was applied to the surface of the polymer material layer of the base material 1 of the type shown in Table 6 by using a bar coater so as to have a film thickness shown in the "joining layer 1E" of Table 6, and heating was performed at 100° C. for 1 minute.

Similarly, the solution for a joining layer, which includes a silane coupling agent of the type shown in Table 6, was applied to one surface of the base material 2 by using a bar coater so as to have a film thickness shown in the "joining layer 2E" of Table 6, and heating was performed at 100° C. for 1 minute.

The solution for an adhesive layer was applied to the surface of the joining layer on the base material 1 by using bar coater so as to have a film thickness shown in the "adhesive layer 1" of Table 6. Similarly, the solution for an adhesive layer was applied to the surface of the joining layer on the base material 2 by using bar coater so as to have a film thickness shown in the "adhesive layer 2" of Table 6.

A laminated body was obtained by bonding the surface on one side of the sheet material to the surface with the solution for an adhesive layer applied thereto, of the base material 1, bonding the surface on the other side of the sheet material to the surface with the solution for an adhesive layer applied thereto, of the base material 2, and performing heating at 100° C. for 3 minutes.

Example b15

The solution for a joining layer, which includes a silane coupling agent of the type shown in Table 6, was applied to both surfaces of the sheet material of the type shown in Table 6 by using a bar coater so as to have a film thickness shown in each of the "joining layer 1S" and the "joining layer 2S" of Table 6, and heating was performed at 100° C. for 1 minute. The sheet material having the surfaces with the solution for a joining layer applied thereto, on both surfaces, obtained in this way, is hereinafter referred to as a "sheet material 2".

Subsequently, a laminated body was obtained in the same manner as in the manufacturing of the laminated body of Example b1, except that the sheet material 2 was used instead of the sheet material used in Example b1.

Example b16

A laminated body was obtained in the same manner as in the manufacturing of the laminated body of Example b15, except that the base material 1 was changed from the base material type A to the base material type B.

Example b17

The solution for an adhesive layer was applied to the surface of the polymer material layer of the base material 1 of the type shown in Table 6 by using bar coater so as to have a film thickness shown in the "adhesive layer 1" of Table 6. Similarly, the solution for an adhesive layer was applied to one surface of the base material 2 by using bar coater so as to have a film thickness shown in the "adhesive layer 2" of Table 6.

A laminated body was obtained by bonding the surface on one side of the sheet material 2 to the surface with the solution for an adhesive layer applied thereto, of the base material 1, bonding the surface on the other side of the sheet material 2 to the surface with the solution for an adhesive layer applied thereto, of the base material 2, and performing heating at 100° C. for 3 minutes.

Example b18

The solution for a joining layer, which includes a silane coupling agent of the type shown in Table 6, was applied to one surface of the sheet material of the type shown in Table 6 by using a bar coater so as to have a film thickness shown in the "joining layer 2S" of Table 6, and heating was performed at 100° C. for 1 minute. The sheet material having the surfaces with the solution for a joining layer applied thereto, on one surface, obtained in this way, is hereinafter referred to as a "sheet material 3".

The solution for a joining layer, which includes a silane coupling agent of the type shown in Table 6, was applied to the surface of the polymer material layer of the base material 1 of the type shown in Table 6 by using a bar coater so as to have a film thickness shown in the "joining layer 1E" of Table 6, and heating was performed at 100° C. for 1 minute. Subsequently, the solution for an adhesive layer was applied to the surface of the joining layer on the base material 1 by using bar coater so as to have a film thickness shown in the "adhesive layer 1" of Table 6.

On the other hand, the solution for an adhesive layer was applied to one surface of the base material 2 of the type shown in Table 6 by using bar coater so as to have a film thickness shown in the "adhesive layer 2" of Table 6, without applying the solution for a joining layer.

A laminated body was obtained by bonding the surface to which the solution for a joining layer is not applied, of the sheet material 3, to the surface with the solution for an adhesive layer applied thereto, of the base material 1, bonding the surface with the solution for a joining layer applied thereto, of the sheet material 3, to the surface with the solution for an adhesive layer applied thereto, of the base material 2, and performing heating at 100° C. for 3 minutes.

Example b19

The solution for an adhesive layer was applied to the surface of the polymer material layer of the base material 1 of the type shown in Table 6 by using bar coater so as to have a film thickness shown in the "adhesive layer 1" of Table 6, without applying the solution for a joining layer.

On the other hand, the solution for a joining layer, which includes a silane coupling agent of the type shown in Table 6, was applied to one surface of the base material 2 of the type shown in Table 6 by using a bar coater so as to have a film thickness shown in the "joining layer 2E" of Table 6, and heating was performed at 100° C. for 1 minute. Subsequently, the solution for an adhesive layer was applied to the surface of the joining layer on the base material 2 by using bar coater so as to have a film thickness shown in the "adhesive layer 2" of Table 6.

A laminated body was obtained by bonding the surface on one side of the sheet material 2 to the surface with the solution for an adhesive layer applied thereto, of the base material 1, bonding the surface on the other side of the sheet material 2 to the surface with the solution for an adhesive layer applied thereto, of the base material 2, and performing heating at 100° C. for 3 minutes.

Comparative Example b4

The solution for an adhesive layer was applied to the surface of the polymer material layer of the base material 1 of the type shown in Table 6 by using bar coater so as to have a film thickness shown in the "adhesive layer 1" of Table 6. Similarly, the solution for an adhesive layer was applied to one surface of the base material 2 by using bar coater so as to have a film thickness shown in the "adhesive layer 2" of Table 6.

A laminated body was obtained by bonding the surface on one side of the sheet material of the type shown in Table 6 to the surface with the solution for an adhesive layer applied thereto, of the base material 1, bonding the surface on the other side of the sheet material to the surface with the solution for an adhesive layer applied thereto, of the base material 2, and performing heating at 100° C. for 3 minutes.

<4. Evaluation Method>

1. Peeling Strength

With respect to each of the laminated bodies of Examples b1 to b19 and Comparative Examples b1 to b4, heating and pressurization were performed at 120° C. for 12 hours while applying a load of 10 kg, whereby a test piece for peeling strength evaluation was made.

The base material 2 was peeled off from the base material 1 of the test piece by the hand, and the destruction state of the peeled surface was visually observed and evaluated according to the following criteria.

AA: Very strong adhesive strength (cohesive failure)

A: Strong adhesive strength (interfacial failure: the degree of a gum tape)

B: Bonded with weak adhesion (interfacial failure: the degree of a vinyl tape)

C: Bonded with very weak adhesion (interfacial failure: the degree of a cellphane tape)

D: Not bonded

2. Film Thickness Fluctuation

The total layer thicknesses at five places in each of the laminated bodies of Examples b1 to b19 and Comparative Examples b1 to b4 were measured using Film thickness meter VL-50A manufactured by Mitutoyo Corporation. Among the obtained measurement results, the difference between the layer thickness of the place having the largest layer thickness and the layer thickness of the place having the smallest layer thickness was set to be a film thickness fluctuation, and evaluation was performed according to the following criteria.

The film thickness fluctuation serves as an index of the in-plane temperature uniformity of a wafer which is fixed to the electrostatic chuck device, and in a case where the film thickness fluctuation is less than 10 μm, the in-plane temperature uniformity of the electrostatic chuck section is excellent.

A: The film thickness fluctuation was less than 3 μm.

B: The film thickness fluctuation was 3 μm or more and less than 10 μm.

C: The film thickness fluctuation was 10 μm or more.

TABLE 6

| | Base material 1 | First adhesion layer | | | | | | Sheet material |
| | | Joining layer 1E | | Adhesive layer 1 | | Joining layer 1S | | |
| | Type | Type | Thickness | Type | Thickness | Type | Thickness | Type |
|---|---|---|---|---|---|---|---|---|
| Example b1 | A | A | 3 nm | A | 3 μm | — | — | A |
| Example b2 | A | A | 20 nm | A | 3 μm | — | — | A |
| Example b3 | A | A | 100 nm | A | 3 μm | — | — | A |
| Example b4 | A | A | 500 nm | A | 3 μm | — | — | A |
| Comparative Example b1 | A | A | 1000 nm | A | 3 μm | — | — | A |
| Comparative Example b2 | A | A | 20 nm | A | 1 μm | — | — | A |
| Example b5 | A | A | 20 nm | A | 3 μm | — | — | A |
| Example b6 | A | A | 20 nm | A | 10 μm | — | — | A |
| Example b7 | A | A | 20 nm | A | 30 μm | — | — | A |
| Comparative Example b3 | A | A | 20 nm | A | 50 μm | — | — | A |
| Example b8 | A | B | 20 nm | A | 3 μm | — | — | A |
| Example b9 | A | C | 20 nm | A | 3 μm | — | — | A |
| Example b10 | A | D | 20 nm | A | 3 μm | — | — | A |
| Example b11 | A | E | 20 nm | A | 3 μm | — | — | A |
| Example b12 | A | F | 20 nm | A | 3 μm | — | — | A |
| Example b13 | A | G | 20 nm | A | 3 μm | — | — | A |
| Example b14 | A | A* | 20 nm | A | 3 μm | — | — | A |
| Example b15 | A | A | 20 nm | A | 3 μm | A | 20 nm | A |
| Example b16 | B | A | 20 nm | A | 3 μm | A | 20 nm | A |
| Example b17 | A | — | — | A | 3 μm | A | 20 nm | A |
| Example b18 | A | A | 20 nm | A | 3 μm | — | — | A |
| Example b19 | A | — | — | A | 3 μm | A | 20 nm | A |
| Comparative Example b4 | A | — | — | A | 3 μm | — | — | A |

| | Second adhesion layer | | | | | | Base material 2 | Evaluation | |
| | Joining layer 2S | | Adhesive layer 2 | | Joining layer 2E | | | Peeling strength | Film thickness fluctuation |
| | Type | Thickness | Type | Thickness | Type | Thickness | Type | | |
|---|---|---|---|---|---|---|---|---|---|
| Example b1 | — | — | A | 3 μm | A | 3 nm | C | A | A |
| Example b2 | — | — | A | 3 μm | A | 20 nm | C | AA | A |
| Example b3 | — | — | A | 3 μm | A | 100 nm | C | AA | A |
| Example b4 | — | — | A | 3 μm | A | 500 nm | C | A | A |
| Comparative Example b1 | — | — | A | 3 μm | A | 1000 nm | C | C | A |
| Comparative Example b2 | — | — | A | 1 μm | A | 20 nm | C | D | A |
| Example b5 | — | — | A | 3 μm | A | 20 nm | C | AA | A |
| Example b6 | — | — | A | 10 μm | A | 20 nm | C | AA | A |
| Example b7 | — | — | A | 30 μm | A | 20 nm | C | AA | A |
| Comparative Example b3 | — | — | A | 50 μm | A | 20 nm | C | AA | C |
| Example b8 | — | — | A | 3 μm | B | 20 nm | C | AA | A |
| Example b9 | — | — | A | 3 μm | C | 20 nm | C | A | A |
| Example b10 | — | — | A | 3 μm | D | 20 nm | C | AA | A |
| Example b11 | — | — | A | 3 μm | E | 20 nm | C | A | A |
| Example b12 | — | — | A | 3 μm | F | 20 nm | C | A | A |
| Example b13 | — | — | A | 3 μm | G | 20 nm | C | A | A |
| Example b14 | — | — | A | 3 μm | A* | 20 nm | C | B | A |
| Example b15 | A | 20 nm | A | 3 μm | A | 20 nm | C | AA | A |
| Example b16 | A | 20 nm | A | 3 μm | A | 20 nm | C | AA | A |
| Example b17 | A | 20 nm | A | 3 μm | — | — | C | AA | A |
| Example b18 | A | 20 nm | A | 3 μm | — | — | C | AA | A |
| Example b19 | A | 20 nm | A | 3 μm | A | 20 nm | C | AA | A |
| Comparative Example b4 | — | — | A | 3 μm | — | — | C | C | A |

As can be seen from Table 6, in the laminated bodies of the examples having the joining layer with a layer thickness in a range of 1 to 500 nm, both the adhesiveness evaluation and the film thickness fluctuation evaluation were high. Therefore, if the electrostatic chuck device each having the laminated configurations of the examples is made, it is expected that the adhesiveness between the electrostatic chuck section and the base section is excellent and the in-plane temperature uniformity of the electrostatic chuck section is excellent.

REFERENCE SIGNS LIST

2: electrostatic chuck section
4: first adhesion layer
6: sheet material
8: second adhesion layer
10: temperature adjusting base section
14: joining layer
18: joining layer
24: silicone adhesive layer
28: silicone adhesive layer
80: electrostatic chuck device
100: electrostatic chuck device
102: electrostatic chuck section
104: first adhesion layer
106: sheet material
108: second adhesion layer
110: base section
114: joining layer
118: joining layer
124: silicone adhesive layer
128: silicone adhesive layer
150: heating member
152: adhesive
160: insulating material layer
162: adhesive

The invention claimed is:

1. An electrostatic chuck device comprising, in the following order:
an electrostatic chuck section having one principal surface serving as a placing surface on which a plate-shaped sample is placed, and having a built-in electrostatic attracting internal electrode;
a first adhesion layer;
a sheet material;
a second adhesion layer; and
a temperature adjusting base section which adjusts a temperature of the electrostatic chuck section to a desired temperature,
wherein the first adhesion layer includes a joining layer having a layer thickness in a range of 1 nm to 500 nm, and a silicone adhesive layer having a thickness in a range of 2 μm to 30 μm, and
the second adhesion layer includes a joining layer having a layer thickness in a range of 1 nm to 500 nm, and a silicone adhesive layer having a thickness in a range of 2 μm to 30 μm.

2. An electrostatic chuck device comprising, in the following order:
an electrostatic chuck section having one principal surface serving as a placing surface on which a plate-shaped sample is placed, and having a built-in electrostatic attracting internal electrode;
a plurality of heating members bonded to a surface on the side opposite to the placing surface of the electrostatic chuck section in a pattern having a gap with respect to one another;
a first adhesion layer;
a sheet material;
a second adhesion layer; and
a base section having a function of cooling the electrostatic chuck section,
wherein the first adhesion layer includes a joining layer having a layer thickness in a range of 1 nm to 500 nm, and a silicone adhesive layer having a thickness in a range of 2 μm to 30 μm, and
the second adhesion layer includes a joining layer having a layer thickness in a range of 1 nm to 500 nm, and a silicone adhesive layer having a thickness in a range of 2 μm to 30 μm.

3. The electrostatic chuck device according to claim 2, further comprising:
a polymer material layer filling up the gap between the heating members,
wherein a layer thickness of the polymer material layer is the same as the shortest distance from the surface on the side opposite to the placing surface of the electrostatic chuck section to a surface on the first adhesion layer side of the heating member.

4. The electrostatic chuck device according to claim 2, further comprising: a polymer material layer filling up the gap between the heating members and covering surfaces of the heating members,
wherein a surface of the polymer material layer is flat.

5. The electrostatic chuck device according to claim 2, further comprising:
an insulating material layer provided between the heating members and the base section.

6. The electrostatic chuck device according to claim 1, wherein the joining layer is a layer having a structure derived from a compound having at least one reactive functional group which is selected from a group consisting of an epoxy group, an isocyanate group, an amino group, a mercapto group, a vinyl group, a styryl group, a methacryl group, an acryl group, an ureido group, a sulfide group, and an isocyanurate group.

7. The electrostatic chuck device according to claim 6, wherein the compound having a reactive functional group further has a hydrolyzable group.

8. The electrostatic chuck device according to claim 7, wherein the compound having a reactive functional group is represented by the following formula (1)

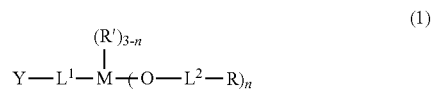

in which Y represents an epoxy group, an isocyanate group, an amino group, a mercapto group, a vinyl group, a styryl group, a methacryl group, an acryl group, an ureido group, a sulfide group, or an isocyanurate group, $L^1$ represents a linking group, M represents a silicon atom, a titanium atom, or a zirconium atom, R represents an alkyl group having 1 to 5 carbon atoms, $L^2$ represents a single bond or carbonyl, n represents an integer of 1, 2, or 3, and R' represents an alkyl group having 1 to 3 carbon atoms, or a phenyl group.

9. The electrostatic chuck device according to claim 1, wherein the sheet material is thicker than a total layer thickness of the first adhesion layer and the second adhesion layer, and a thickness of the sheet material is in a range of 20 μm to 500 μm.

10. The electrostatic chuck device according to claim 1, wherein the sheet material contains any one which is selected from a group consisting of a silicone-based elastomer and a fluorine-based elastomer.

11. The electrostatic chuck device according to claim 1, wherein the placing surface is composed of an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

* * * * *